United States Patent
Viens et al.

(10) Patent No.: US 7,566,942 B2
(45) Date of Patent: Jul. 28, 2009

(54) MULTI-SPECTRAL PIXEL AND FOCAL PLANE ARRAY

(75) Inventors: Jean Francois Viens, Boston, MA (US); Anuradha M. Agarwal, Weston, MA (US); Lionel C. Kimerling, Concord, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 248 days.

(21) Appl. No.: 11/251,955

(22) Filed: Oct. 17, 2005

(65) Prior Publication Data
US 2006/0091284 A1    May 4, 2006

Related U.S. Application Data

(60) Provisional application No. 60/620,612, filed on Oct. 20, 2004, provisional application No. 60/629,622, filed on Nov. 19, 2004.

(51) Int. Cl.
*H01L 31/0272* (2006.01)

(52) U.S. Cl. .................. 257/440; 257/21; 257/184; 257/443; 257/E31.01; 257/432

(58) Field of Classification Search .............. 257/440
See application file for complete search history.

(56) References Cited

U.S. PATENT DOCUMENTS

| 4,555,720 A | 11/1985 | Readhead |
| 4,625,389 A | 12/1986 | Readhead |
| 4,956,555 A | 9/1990 | Woodberry |
| 5,157,258 A | 10/1992 | Gunning, III et al. |
| 5,315,128 A | 5/1994 | Hunt et al. |
| 5,389,797 A * | 2/1995 | Bryan et al. .......... 257/21 |
| 5,455,421 A | 10/1995 | Spears |
| 5,528,051 A | 6/1996 | Nuyen |

(Continued)

FOREIGN PATENT DOCUMENTS

WO    9919912    4/1999

(Continued)

OTHER PUBLICATIONS

Unlu et al., "High Speed Si resonant cavity enhanced photodetectors and arrays" 2004 American Vacuum Society, J. Vac. Sci. Technol. A 22(3) May/Jun. 2004, pp. 781-787.

(Continued)

*Primary Examiner*—Jerome Jackson, Jr.
(74) *Attorney, Agent, or Firm*—Gauthier & Connors LLP

(57) ABSTRACT

A novel detection pixel micro-structure allowing the simultaneous and continuous detection of several discrete optical frequencies. A focal plane array comprises a plurality of multi-spectral detection pixels and a connecting platform to electrically connect the pixels. Each of the multi-spectral detection pixels form a resonant optical structure that comprises at least two periodic latticed dielectric reflectors, and at least one optical cavity between the said latticed dielectric reflectors. The latticed dielectric reflectors create a plurality of photonic bandgaps in the spectral response of the pixel. In addition, each optical cavity of the pixel comprises at least two optical resonant modes, corresponding to localized Bloch modes supported by the pixel dielectric structure, wherein each optical resonant mode is localized maximally at, and minimally away from, the optical cavity.

27 Claims, 25 Drawing Sheets

U.S. PATENT DOCUMENTS

| | | | |
|---|---|---|---|
| 5,581,094 | A | 12/1996 | Hara et al. |
| 5,818,066 | A | 10/1998 | Duboz |
| 6,111,266 | A | 8/2000 | Carline et al. |
| 6,157,042 | A | 12/2000 | Dodd |
| 6,452,187 | B1 | 9/2002 | Claiborne et al. |
| 6,469,358 | B1 | 10/2002 | Martin |
| 6,759,235 | B2 | 7/2004 | Empedocles et al. |
| 7,238,960 | B2 * | 7/2007 | Sundaram et al. ............. 257/21 |
| 2004/0195509 | A1 | 10/2004 | Sundaram et al. |

FOREIGN PATENT DOCUMENTS

| | | |
|---|---|---|
| WO | 0077861 | 12/2000 |

OTHER PUBLICATIONS

Unlu et al., "Wavelength Demultiplexing Heterojunction Phototransistor" 8030 Electronics Letters, 26 (1999) Oct. 25, No. 221, pp. 1857-1858.

Mitra et al., "Multispectral long-wavelength quantum-well infrared photodetectors" Applied Physics Letters, vol. 82 No. 19, May 12, 2003, pp. 3185-3187.

\* cited by examiner

MULTI-SPECTRAL PIXEL AND FOCAL PLANE ARRAY

This application claims priority from U.S. provisional applications Ser. Nos. 60/620,612 filed on Oct. 20, 2004, and 60/629,622 filed Nov. 19, 2004, both of which are incorporated herein by reference in their entireties.

BACKGROUND OF THE INVENTION

The invention relates to a novel detection pixel micro-structure allowing the simultaneous and continuous detection of several discrete optical frequencies, wherein a plurality of such pixels can be combined to form a focal plane array for a multi-spectral digital camera.

As camera technology continues to advance, there is a growing demand for multi-spectral detectors for advanced camera systems featuring better intelligence functions such as target discrimination and identification, while retaining the maturity and low-cost structure of very large scale integration (VLSI) processing. A multiplicity of defense and commercial programs require the utilization of infrared focal plane arrays for the acquisition of a broad range of spectral, temporal and spatial data, with a demand on small device size, low power consumption, low premium and utilization costs, compatibility to 30 Hz video frame rate and with at least a 1024×1024 pixel resolution.

So far, multiple spectral band measurements have been achieved using separate focal plane arrays with fixed filters, a mechanical filter wheel, or a dithering system with a striped filter, or an interleaved array of single-spectral pixels having different spectral responses, or a quantum well optoelectronic structure (e.g. QWIP devices). These approaches are expensive, and require cumbersome spatial alignment and temporal registration, or require complex lithographic fabrication processes. Thus, a single focal plane array with multi-spectral capabilities that circumvent these problems is very desirable because it can significantly simplify the design, and reduce the size, cost, weight and power consumption of the camera system.

SUMMARY OF THE INVENTION

The invention relates to the micro-structural details of the optical detection pixel, scaled to an array of several such pixels, in order to form the focal plane array of a multi-spectral digital camera. The invention allows such digital camera to detect light simultaneously at several different optical frequencies, with desired optical frequencies and resolution, and to form several images of the same target at each said desired optical frequencies, using only a single monolithic focal plane array. The invention addresses the need for multi-spectral digital cameras, where the camera can generate several image frames of a same target at different optical frequencies, for enhanced image detection and recognition. The invention provides a way to fabricate monolithically such multi-spectral focal plane arrays at low cost and using widely available semiconductor industry fabrication tools.

It is an object of the invention to provide a novel detection pixel micro-structure allowing the simultaneous and continuous detection of several discrete optical frequencies, wherein a plurality of such pixels can be combined to form a focal plane array for a multi-spectral digital camera. The invention includes a focal plane array comprising a plurality of multi-spectral detection pixels and a connecting platform to electrically connect the said pixels. Each of the multi-spectral detection pixels form a resonant optical structure that comprises at least two periodic latticed dielectric reflectors, and at least one optical cavity between the said latticed dielectric reflectors, wherein the latticed dielectric reflectors create a plurality of photonic bandgaps in the spectral response of said pixel.

In addition, each of the optical cavity comprises at least two optical resonant modes, corresponding to localized Bloch modes supported by the pixel dielectric structure, wherein each optical resonant mode is localized maximally at, and minimally away from, the optical cavity, and wherein each optical resonant mode has a unique electromagnetic field distribution determined by its frequency and by the dielectric profile of the pixel. The frequency-specific detection of light is made possible by metal-semiconductor-insulator inclusions inside the optical cavity. Each of these inclusions is located at one of the electromagnetic field amplitude maxima of one of the said optical resonant mode, for maximal field overlap and tapping, and each inclusion performs optical-to-electrical signal conversion by way of photoconductivity or photovoltaic effect. Each electrical signal generated and carried by the inclusion is brought to the connecting platform for subsequent image readout and processing. The said connecting platform can connect a plurality of such multi-spectral pixels to form the readout platform of a focal plane array of a multi-spectral digital camera.

This novel detection pixel micro-structure can be designed to allow the simultaneous detection of several different optical frequencies, from two to more than five different optical frequencies. By a judicious choice of pixel materials the optical detection capability can be extended from the ultraviolet regime down to the infrared regime, including the visible regime. The capacity to detect simultaneously several different optical light wave frequencies is described as "multi-spectral", as multiple spectral bands can be detected simultaneously and continuously by the pixel. A plurality of such pixels, up to several millions identical pixels, can be combined to form the focal plane array of a multi-spectral digital camera, wherein the focal plane array and the digital camera are rendered multi-spectral from the capacity of each pixel of the focal plane array to detect simultaneously multiple spectral bands.

The invention allows such digital camera to detect light simultaneously at several different optical frequencies, with desired optical frequencies and resolution, and to form several images of the same target at each said desired optical frequencies, using only a single monolithic focal plane array. In an exemplary embodiment, the pixel is designed to detect simultaneously visible and infrared optical frequencies, such as to form the focal plane array of a multi-spectral camera combining visible and infrared detection.

While the invention, and its various embodiments described here, particularly relate to multi-spectral pixels and focal plane arrays combining visible and infrared detection, the inventive pixel micro-structure described below is not limited to these particular wavelength regimes, as it can be scaled to detect light waves from ultraviolet, to visible, to infrared optical frequencies.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

DETAILED DESCRIPTION OF THE INVENTION

The invention includes a focal plane array comprising a plurality of multi-spectral detection pixels. A focal plane array is a planar arrangement of individual optical detectors (called pixels) located at the focal plane of an optical lens system, wherein each individual optical detectors (pixels) convert the incident optical signal from the lens system into an electrical signal, wherein each electrical signals are collected by an integrated electronic circuit and combined by a readout system to reproduce digitally the optical image of the target. Such focal plane array is used as the optical detector device of a digital camera.

It is an object of the invention to provide a novel pixel micro-structure allowing the simultaneous and continuous detection of several discrete optical frequencies, wherein a plurality of such inventive pixels can be combined to form the focal plane array of a digital camera, with multi-spectral detection capability. The capacity to detect simultaneously several different optical frequencies is described as "multi-spectral", as multiple spectral bands can be detected simultaneously and continuously by the pixel. The focal plane array and the digital camera are rendered multi-spectral by the capacity of each pixel of the focal plane array to detect simultaneously multiple spectral bands, or multiple optical frequencies. The invention allows such digital camera to detect light simultaneously at several different optical frequencies, with desired optical frequencies and resolution, and to form several images of the same target at each said desired optical frequencies, using only a single monolithic focal plane array. The invention particularly relates to the micro-structural design of the inventive pixel that allows multi-spectral detection of light comprising the visible and infrared optical frequency regimes.

The multi-spectral focal plane array in accordance with the invention detects at least one optical frequency in the visible optical regime and at least one optical frequency in the infrared optical regime. The visible optical regime corresponds to the range of optical wavelengths between 360 nm and 700 nm, while the infrared optical regime corresponds to the range of optical wavelengths between 700 nm and 100000 nm.

Figure 1:
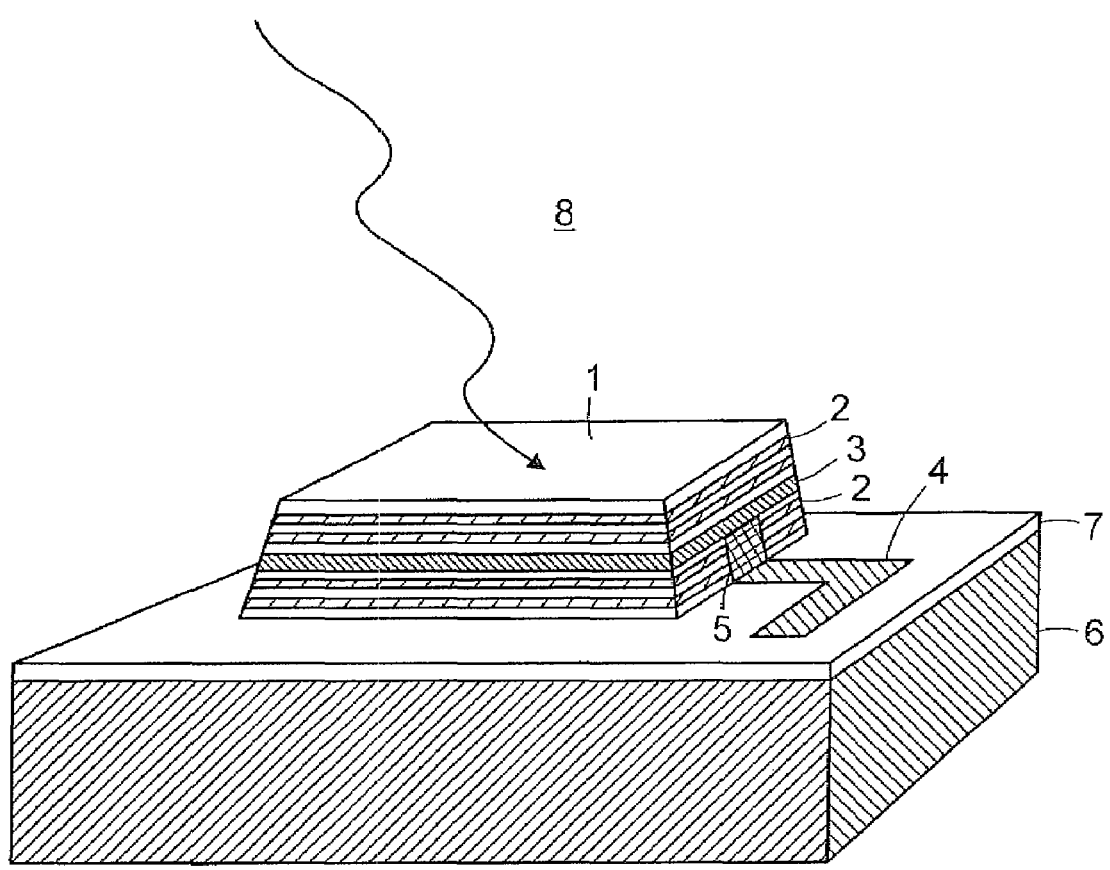
FIG. 1 is a schematic of a multi-spectral detection pixel in accordance with the invention, in which a plurality of such multi-spectral detection pixels can be combined to form a focal plane array for a multi-spectral digital camera.
Figure 2:
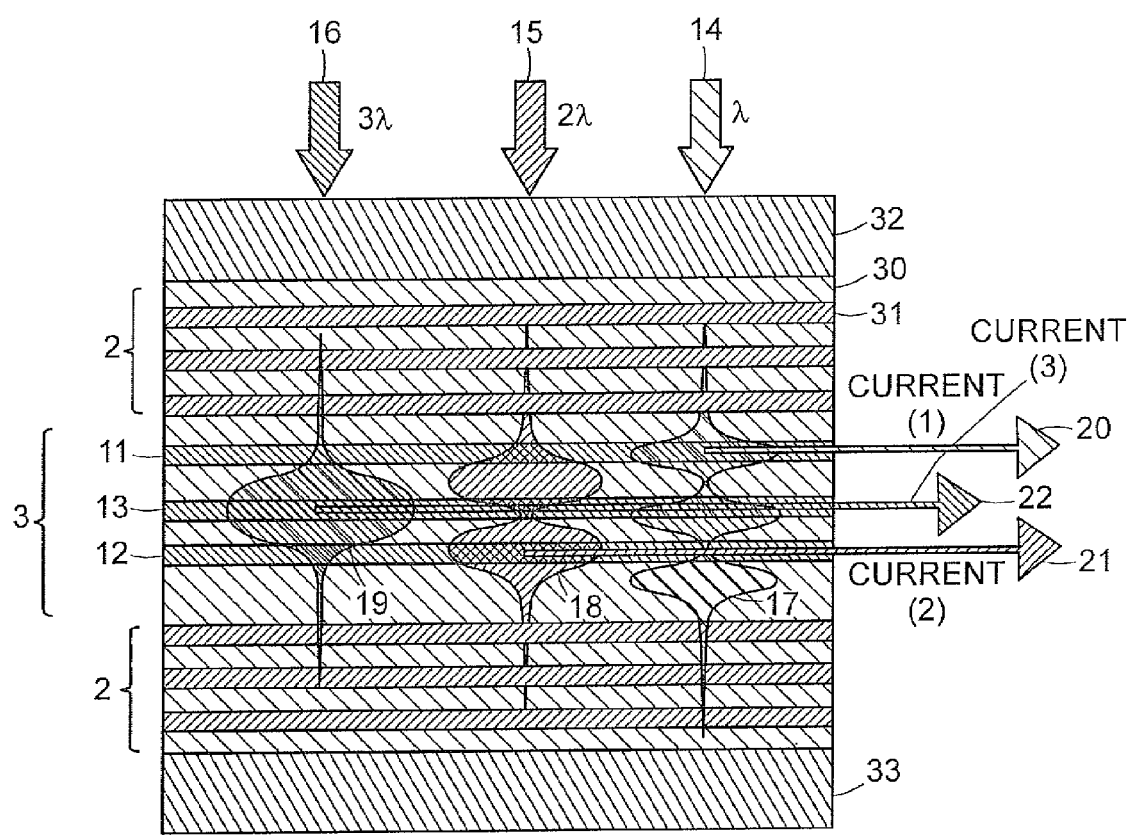
FIG. 2 is a schematic cross-section of a multi-spectral detection pixel illustrated in FIG. 1, with three detected optical frequencies.

A multi-spectral detection pixel in accordance with the invention is illustrated schematically in FIGS. 1 and 2. The multi-spectral detection pixel [1] includes a resonant optical micro-structure that comprises at least two periodic latticed dielectric reflectors [2], and at least one optical cavity [3] between the latticed dielectric reflectors [2]. A plurality of metallic connection line such as the one shown in [4] are provided at the sidewall [5] of the pixel to electrically connect the optically active inclusions [11] [12] [13] inside the optical cavity [3] to a connecting platform [6] for signal readout and processing.

In accordance with the invention, a "connecting platform" consists of a platform receiving, distributing and processing a plurality of electrical signals. The purpose of the connecting platform [6] is to collect the electrical signals generated by each pixel and to distribute the electrical signals to an electronic circuit for subsequent image processing. It consists typically of a silicon integrated circuit chip. It can also consist of a ceramic integrated circuit chip or a flexible polymer integrated circuit sheet. The inventive pixel is to a large extent independent of the particularities of the connecting platform where it is deposited. The pixel can be deposited directly on the connecting platform.

However, it may happen that the coefficient of thermal expansion of the connecting platform (e.g. a silicon chip) does not match the coefficient of thermal expansion of the pixel material (e.g. chalcogenide semiconductors), producing unwanted mechanical strains inside the pixel with possible detrimental mechanical and optical effects, such as mechanical failure, surface delaminating, pixel cracking, pixel spectral response drift or optical birefringence. In this case, it is possible to eliminate such effects by introducing a strain relief layer [7] at the interfacial junction between the pixel and the connecting platform, in order to absorb the mechanical strains produced by a mismatch of coefficients of thermal expansion and to prevent the strains from being transmitted to the pixel. Such a strain relief layer can be made of polymer or glass materials.

A plurality of multi-spectral detection pixels of FIG. 1 can be combined to form an array of closely spaced multi-spectral pixels, such as to form a focal plane array for a digital camera. As is known in the art of digital cameras, the array of pixels can have a pixel count of up to 1024×1024, or 2048×2048, or 4096×4096, or 8192×8192, or more. In general, the focal plane array in accordance with the invention consists of a two-dimensional array of N-by-M pixels (or equivalently, N×M pixels), wherein N and M are the horizontal and vertical pixel counts respectively, which can be any integer number equal to 1 or larger. Exemplary arrays can have 1×1024 pixels, or 10×2048 pixels, or 512×8192 pixels, etc., and the arrays can have different pixel sizes across the array, or different pixel densities across the array, or different pixel spectral responses across the array, or different pixel shapes across the array. The connecting platform connects every individual pixel in order to form the readout platform of the focal plane array, in accordance with standard Very-Large-Scale-Integration (VLSI) design and fabrication technology.

The detection pixel [1] can have a square, rectangular, triangular, circular or trapezoidal surface shape. Any other surface shapes are allowable, as long as they provide convenient sidewall space to deposit connection lines such as [4], or provide sufficient surface contact for a bond wire from the pixel to the connecting platform. The size of the pixel [1] is typically larger than the wavelength of light [8] incident on the pixel in order to avoid, by virtue of diffractive effects, optical scattering at the pixel sidewalls [5]. In this invention, the pixel is intended to detect light from anywhere between the ultraviolet to the infrared optical frequencies, commensurate with wavelengths between about 0.2 micrometer to about 12 micrometers, such that the pixel size is typically larger than about 1 micrometer. Therefore, the surface area of the pixel is typically larger than about 1 micrometer square. The light wave impinging the pixel [8] can be incident at normal angle, or at some other angle, with respect to the surface of the pixel. The allowable range of incident angles is typically between 0 degree and 75 degrees. This provides a wide enough angular range such that a large numerical aperture lens objective can be used with the camera system.

The cross-section of the multi-spectral detection pixel in accordance with the invention is illustrated schematically in FIG. 2. The multi-spectral detection pixel [1] includes a resonant optical micro-structure that comprises at least two periodic latticed dielectric reflectors [2], and at least one optical cavity [3] between the latticed dielectric reflectors. Optically active metal-semiconductor-insulator inclusions [11], [12] and [13] are located inside the optical cavity [3]. The purpose of these inclusions is to convert the incident optical signals [14], [15], [16], of wavelengths $\lambda$, $2\lambda$ and $3\lambda$, respectively, into electrical signals [20], [21], [22], respectively, by virtue of an optimal overlap between the inclusions [11], [12], [13] and one of the electromagnetic field profile maxima of the respective localized resonant modes [17], [18], [19] inside the optical cavity [3].

The optical-to-electrical signal conversion is made possible by photoconductive effect or photovoltaic effect in each of the said metal-semiconductor-insulator inclusions. The purpose of the two extremity layers [32] [33] is to insure symmetry in the refractive index profile of the dielectric stack [2] [3] for optimal spectral response of the device, and they can serve also as passivation layers, or protective layers, for the periodic lattices reflectors [2] against oxygen and/or water diffusive contamination. The two extremity layers [32] [33] can be single dielectric layers or comprise a plurality of dielectric layers, or equivalently a stack of dielectric layers. In an exemplary embodiment the two extremity layers [32] [33] are supplemental periodic latticed dielectric reflectors placed at the surface of the periodic latticed dielectric reflectors previously described in [2], but with different characteristic periodicities in order to reflect light at different wavelengths than the previously described periodic latticed dielectric reflectors [2].

FIG. 2 illustrates the example of a pixel designed to detect three different optical frequencies incident on the top of the pixel [1] shown in FIG. 1; wherein incident optical frequency [14] generates a localized resonant mode [17] inside the cavity, which maximally overlaps with, and electrically activates, the metal-semiconductor-insulator inclusion [11], which then converts the resonant optical signal [17] into an electrical signal [20], the electrical signal is then conducted to the connecting platform [6] via the pixel sidewall [5] by a connection line similar to [4]. Simultaneously, incident optical frequency [15] generates a localized resonant mode [18] inside the cavity, which maximally overlaps with, and electrically activates, its respective metal-semiconductor-insulator inclusion [12], which then converts the resonant optical signal [18] into an electrical signal [21], the electrical signal is then conducted to the connecting platform [6] via the pixel sidewall [5] by a connection line similar to [4].

Simultaneously, incident optical frequency [16] generates a localized resonant mode [19] inside the cavity, which maximally overlaps with, and electrically activates, its respective metal-semiconductor-insulator inclusion [13], which then converts the resonant optical signal [19] into an electrical signal [22], the electrical signal is then conducted to the connecting platform [6] via the pixel sidewall [5] by a connection line similar to [4]. Therefore, in this example, a single pixel can detect simultaneously three different optical frequencies and generate electrical currents with amplitudes commensurate with the intensities of each of these optical frequencies incident on the pixel. A focal plane array made of individual pixels such as the one illustrated in FIG. 2 will provide three different image frames, each frames corresponding to optical frequencies [14], [15] and [16].

Such a multi-spectral pixel, illustrated in FIG. 2, is not limited to three different optical frequencies. The inventive multi-spectral pixel, by judicious design, is amenable to the detection of anywhere between two to more than five different optical frequencies. The multi-spectral focal plane array in accordance with the invention is designed to detect at least one optical frequency in the visible optical regime and at least one optical frequency in the infrared optical regime. The visible optical regime corresponds to the range of optical wavelengths between 360 nm and 700 nm, while the infrared optical regime corresponds to the range of optical wavelengths between 700 nm and 100000 nm.

The periodic latticed dielectric reflector structures [2] can be made of amorphous, glassy, polycrystalline or crystalline dielectric materials and should be transparent at the optical frequencies of the resonant modes inside the optical cavity [3]. In addition, the periodic latticed dielectric reflector structures [2] are made of alternating layers of low refractive index [30] and high refractive index [31] materials, wherein the refractive indices of the alternating materials are in the range between n=1 and n=7. The periodic latticed dielectric reflector structures [2] can have the same thickness, or can have different thicknesses, from low number of alternating layers (0 to 6 layers) to high number of alternating layers (more than 6 layers). The index difference between the alternating layers of low refractive index and high refractive index is preferably larger than Δn=0.5 in order to provide a large photonic bandgap. The periodic latticed dielectric reflector structures [2] are preferably made of transparent dielectric materials, wherein a dielectric material is characterized by its relatively low electrical conductivity and its large electrical-conduction activation energy, but are not restricted to a specific chemical composition of material, as dielectrics are available in a wide range of chemical compositions.

The arts of electromagnetism and solid state physics can describe the electromagnetic modes supported by the periodic latticed dielectric reflector structure. Because the structure is periodic, general symmetry properties apply, such as the dielectric potential profile of the structure V(z) which can be described by a Bravais lattice, $$V(z)=V(z+z_n), z_n=na \quad (1)$$

where z represents the position in the structure and $z_n$ an arbitrary translation vector of the periodic lattice, which consists of multiples n of the basis vector a of the real-space lattice, corresponding to the characteristic length of the structure periodicity.

Since the dielectric potential V(z) has the same periodicity as the lattice it can be expanded in the following Fourier series, $$V(z)=\Sigma V_G \exp(iGz) \quad (2)$$

where $V_G$ are the Fourier coefficients of the series, and the vector G is a multiple h of the reciprocal lattice vector, G=h2π/a. The electromagnetic modes supported by the periodic latticed dielectric reflector structure are determined by the solutions of the well known Schrödinger equation $$H\psi(z)=[-\hbar^2 d^2/dz^2/2m+V(z)]\psi(z)=E\psi(z) \quad (3)$$

where H is the Hamiltonian of the structure, detailed in the brackets, E the energy of the mode (also called "eigenvalue") and ψ(z) the wave function of the mode (also called "eigenstate", or quantum state).

The most general steady-state solution of the Schrödinger equation comprising a periodic term V(z) in its Hamiltonian is a plane wave expansion of the wave function ψ(z) described by $$\psi(z)=\Sigma C_k \exp(ikz) \quad (4)$$

Here k is a point in reciprocal space that is compatible with the periodic boundary conditions of the structure. The periodic structure will accommodate as many modes as there are lattices, according to which the energy eigenvalues and eigenstates may be indexed with a band number n commensurate with increasing energies of the eigenvalues. In other words, the Schrödinger equation has as many solutions as there are lattices in the periodic structure, and the general form of the solutions can be written as a modulated plane wave $$\psi(z)=u_k(z)\exp(ikz) \quad (5)$$

with a modulation function $$u_k(z)=u_k(z+z_n) \quad (6)$$

that has the periodicity of the lattice. This result is known as Bloch's theorem, and the wave functions ψ(z) are called the Bloch waves, or Bloch states, or Bloch modes.

The approach to an understanding of this pixel microstructure is to allow a plane wave to propagate through the material and to consider the multiple reflections that take place at each interface of the alternating layers [30] [31] and below. By applying symmetry arguments, a person skilled in the arts of electromagnetism and solid state physics can describe the electromagnetic modes supported by the pixel micro-structure in the Bloch form, which is the form of a plane wave times a function with the periodicity of the lattice:

$$\psi_k(z)=u_k(z)\exp(ikz) \quad (7)$$

where $\psi_k$ is the electromagnetic field amplitude profile of the Bloch mode, or eigenstate, as function of the position z in the pixel micro-structure; $u_n(z)$ is a z-periodic function such that $u_k(z)=u_k(z+z_n)$ whenever $z_n$ is an integral multiple of the alternating layer spacing a; k is the wave vector of the Bloch mode; and n is the band number of allowed modes.

A key feature of Bloch's theorem is that the dielectric periodicity in the pixel's latticed micro-structure [2] induces a frequency gap in the range of modes allowed to propagate in the micro-structure. Such a frequency gap, where no modes can propagate within that frequency range, is called a photonic bandgap. No purely real wave vector k (i.e. propagating mode) exists for any mode within that frequency range. Instead, the wave vector is complex, such that the wave vector takes an imaginary component: k=k−iκ. Within the frequency range of the photonic bandgap there are no extended states like the mode given by equation (7), instead the modes are evanescent, or decaying exponentially, in the Bloch form:

$$\psi_k(z)=u_k(z)\exp(ikz)\exp(-\kappa_n z) \quad (8)$$

The imaginary component $\kappa_n$ of the wave vector causes the decay of the electromagnetic field profile inside the periodic dielectric structure on a length scale of $1/\kappa_n$ and the incident wave will be reflected for all frequencies within the photonic bandgap. By virtue of Bloch's theorem, $u_k(z)$ is a z-periodic function such that $u_k(z)=u_k(z+z_n)$, therefore the spectral response of a periodic structure will feature multiple photonic bandgaps periodically spaced in frequencies. Thus, the spectral response of the periodic structure will feature a fundamental photonic bandgap at low frequencies and higher order photonic bandgaps at higher frequencies.

When the symmetry of the periodic structure, such as the dielectric reflector structure [2], is broken by a defect, such as the cavity [3], decaying modes can be localized inside the defect as long as there is a lightwave source to generate, or excite, these localized modes. A defect permits localized modes to exist, with frequencies inside the photonic bandgap. If a mode has a frequency inside the photonic bandgap, then it must exponentially decay once it enters the periodic structure [2]. The periodic latticed dielectric reflector structures [2] on both sides of the defect [3] act like frequency-specific mirrors. If two or more such films are oriented parallel to one another, which is the case for reflectors fabricated via a monolithic thin film deposition process, any z-propagating light trapped between them will bounce back and forth between these mirrors. Because the distance between the mirrors, corresponding to the cavity length, is of the order of the light's wavelength, the modes are quantized. Therefore, localized resonant electromagnetic modes can exist in the micro-structured pixel such as the one illustrated in FIG. 2, and the frequency of these localized resonant modes are determined by the frequency range of the photonic bandgap of the periodic latticed dielectric reflector structures [2] on both sides of the cavity [3].

Quantized localized states exist in the cavity as long as the photonic bandgaps of the periodic latticed dielectric reflector structures [2] overlap. Such a localized resonant mode, obeying the premises of Bloch's theorem, can be described by the following wave functions, or eigenstates, $$\psi_k(z) = u_k(z)\exp(ikz)\exp(-\kappa_n|z-z_o|) \quad (9)$$

and are called localized Bloch modes, or localized resonant modes. The eigenstate magnitude of such a localized Bloch mode is maximal at a reference position $z_o$, and decays evanescently away from this position. This position $z_o$ usually corresponds to the middle point of the defect in the dielectric reflector structure, or equivalently to the middle point of the pixel's cavity [3]. The optical resonant mode is a localized Bloch mode because the eigenstate is localized maximally at position $z_o$, which resides inside the pixel's optical cavity, and decays away from this position on every side. The localized resonant modes are localized maximally at, and minimally away from, the pixel optical cavity.

Bloch's theorem equation can be solved as an eigenvalue-eigenvector problem, with unique or degenerate solutions. Therefore, a method to determine the electromagnetic field profile $\psi_k(z)$ of the localized resonant modes is to calculate the eigenvectors (or equivalently the eigenstates) of the micro-structured dielectric pixel, while a calculation of the eigenvalues will provide the frequencies of the localized resonant modes. Because the eigenstates are discrete quantum states, the electromagnetic field profiles (eigenstates) and frequencies (eigenvalues) are generally unique in such microstructure; the degeneracies, or non-uniqueness, are usually attributable to different polarization modes during pixel illumination at normal incidence, such as transverse electric (TE) and transverse magnetic (TM) modes, which are usually excited upon normal incidence light illumination, and which can be isolated using a polarizer in front of the pixel.

The pixel in accordance with the invention supports Bloch's modes which are photonic localized eigenstates, not electronic localized eigenstates. As is known in the art, photonic localized eigenstates (i.e. photons) are governed by Bose-Einstein statistics, whereas electronic localized eigenstates (i.e. electrons) are governed by Fermi-Dirac statistics, the two statistic descriptions being characterized by fundamentally different energy distributions of the eigenstates (i.e. eigenvalue distributions of the eigenstates), which make related embodiments completely different. Many photons can occupy the same localized eigenstate, thus making the intensity of the localized eigenstate proportional to the intensity of incident light on the pixel, and thus allowing the photo-detection of light proportional to the intensity of incident light on the pixel. The pixel in accordance with the invention supports photonic modes, not electronic modes, whereas the photonic modes are converted to electrical signals via a necessary photo-electric transduction mechanism.

The density of states of a system is the number of allowed states per unit increase in frequency. If a single localized resonant mode is introduced into the photonic bandgap, then the density of states is zero in the photonic bandgap except for a single peak associated with the defect. The density of localized states in the photonic bandgap is determined by the physical length of the cavity [3], wherein a cavity of length L will induce an optical phase shift of $\phi$ given by $$knL=\phi \quad (10)$$

where k is the wave vector of the first Brillouin zone edge ($k=\pi/a$) and n is the refractive index of the optical cavity material, and where "a" is the periodicity length of the periodic latticed dielectric reflector structures. There will be one allowed localized resonant modes inside the cavity for every increment of $2\pi$ of phase shift $\phi$, therefore the number N of localized resonant modes in a cavity of length L will be given by the following incremental relation $$2\pi(N-1) < nL\pi/a \leq 2\pi N \quad (11)$$

The spectral response of the pixel can therefore be intentionally designed to support a plurality of localized resonant modes, with frequencies within each of the fundamental as well as higher order photonic bandgaps. Changing the length L of the optical cavity will change the density of states N within the photonic bandgaps. In other words, the length L of the optical cavity can be designed to support a specific desired density of states N within the photonic bandgaps of the periodic lattices structure. The density of states determines the number of localized Bloch modes, or localized eigenstates, contained in the optical cavity, and the respective difference in optical frequency between the localized modes. One pixel can support a plurality of localized modes with electromagnetic field profiles centered maximally at, and minimally away from, the optical cavity. By virtue of Bloch's theorem, each of the localized resonant modes is quantized and has a unique electromagnetic field profile $\psi_k(z)$ and unique optical frequency; degeneracies (or non-uniquenesses) are usually attributable to different polarization modes during pixel illumination at normal incidence, such as transverse electric (TE) and transverse magnetic (TM) modes.

Modal Discrimination of Localized Eigenstates:

The uniqueness in the eigenstates and eigenvalues of the localized photonic modes supported by the pixel can be used to provide modal discrimination in the spectral response of the metal-semiconductor-insulator inclusions [11], [12] and [13]. By judicious design, each of these inclusions can be placed at one of the electromagnetic field amplitude maxima of one of the said optical resonant mode. Consequently, the inclusion will tap maximally the electromagnetic field of only one localized resonant mode, and minimally the electromagnetic fields of the other resonant modes.

In accordance with the present invention, modal discrimination of localized eigenstates relates to the inventive scheme wherein a photodetector (e.g., a metal-semiconductor-insulator inclusion) can be placed and fixed such as to optically absorb and electrically detect preferentially only one localized resonant mode out of a plurality of localized resonant modes inside a resonant optical cavity, based on the property of these modes to be quantized and localized electromagnetic Bloch modes, wherein the electromagnetic field profile (i.e. eigenstate) and optical frequency (i.e. eigenvalue) are unique to each modes. The photodetector is placed such as to discriminate one specific mode out of a plurality of modes.

The multi-spectral capacity of the inventive pixel, and its frequency-specific photo detection, are based on modal discrimination of localized eigenstates, wherein several metal-semiconductor-insulator inclusions are introduced inside the pixel's optical cavity in order to absorb and detect different individual resonant modes. Modal discrimination of localized eigenstates is best performed when the thickness of the metal-semiconductor-insulator inclusion is small, preferably smaller than one lobe of the electromagnetic field profile $\psi_k(z)$ of the mode it is designed to detect, which corresponds to half the wavelength of the mode in the cavity dielectric material. Modal discrimination of localized eigenstates is the key in understanding the inventive scheme of multi-spectral detection pixel, and is best applicable to quantized localized modes inside a resonator.

The pixel's photodetectors are metal-semiconductor-insulator inclusions placed inside the pixel's optical cavity. The metal-semiconductor-insulator inclusions are made of a lattice of high electrical conductivity (e.g. metal), medium electrical conductivity (e.g. semiconductor) and low electrical conductivity (e.g. insulator) materials. The medium electrical conductivity material can be an amorphous, glassy, polycrystalline or crystalline semiconductor, with an optical-to-electrical conversion effect (transduction) based on electro-hole pair generation in the material upon light illumination.

The semiconductor part of the metal-semiconductor-insulator inclusion has an absorption spectrum covering the optical frequency of the specific optical resonant mode. Therefore, the semiconductor part of the inclusion generates an electrical signal when light is absorbed from the specific localized resonant mode. The metal-semiconductor-insulator inclusion can form a photoconductive optical detector, or a p-n junction photovoltaic optical detector, or a p-i-n junction photovoltaic optical detector, or a metal-semiconductor-metal optical detector, in accordance with an optical-to-electrical conversion effect based on electro-hole pair generation in the semiconductor material upon light illumination. The electrical signal generated in the semiconductor material is carried by the high electrical conductivity (e.g. metal) part of the inclusion, and brought to the connecting platform [6] for subsequent readout and processing. To avoid electrical crosstalk within the optical cavity, each inclusion must be electrically insulated from the neighbor inclusions by layers of low electrical conductivity (e.g. insulator) material. The low electrical conductivity (e.g. insulator) material can be a dielectric material, and can be the same as the optical cavity material.

Figure 3A:
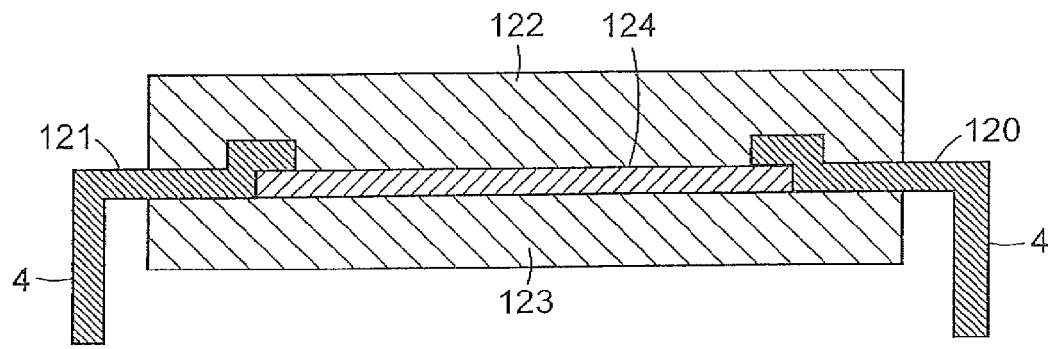
FIGS. 3A-3C are block diagrams of exemplary embodiments of the metal-semiconductor-insulator inclusion in accordance with the invention.
Figure 3B:
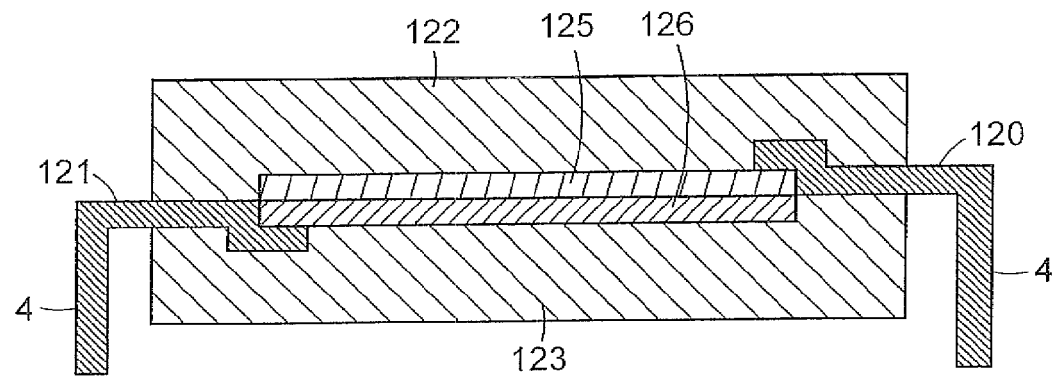
Figure 3C:
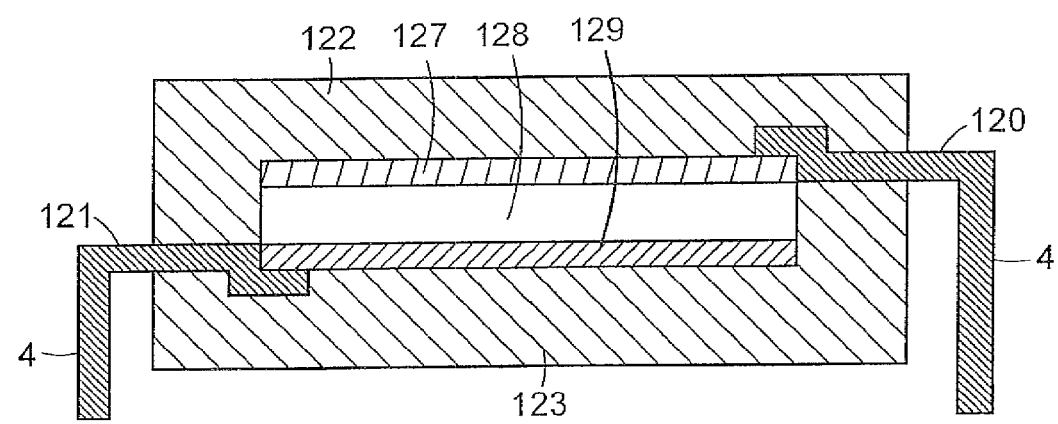

FIG. 3 illustrates exemplary embodiments of the metal-semiconductor-insulator inclusions placed inside the optical cavity. The metal-semiconductor-insulator inclusion can form a photoconductive optical detector, with the metal parts [120] [121] in contact with the photoconductive semiconductor layer [124] placed at one of the maxima of the electromagnetic field profile $\psi_k(z)$ of the mode it is designed to detect, and the current generated by the photoconductive inclusion is electrically insulated by the insulator parts [122] [123] of the inclusion. Alternatively, the metal-semiconductor-insulator inclusion can form a p-n photovoltaic optical detector, with the metal part [120] in contact with the p-type (or n-type) semiconductor layer [125], the other metal part [121] in contact with the n-type (or p-type) semiconductor layer [126], whereas the bilayer [125] [126] is placed at one of the maxima of the electromagnetic field profile $\psi_k(z)$ of the mode it is designed to detect, and the current generated by the p-n photovoltaic inclusion is electrically insulated by the insulator parts [122] [123] of the inclusion.

Alternatively, the metal-semiconductor-insulator inclusion can form a p-i-n photovoltaic optical detector, with the metal part [120] in contact with the p-type (or n-type) semiconductor layer [127], the other metal part [121] in contact with the n-type (or p-type) semiconductor layer [129], whereas the p-type and n-type layers are separated by an intrinsic semiconductor layer [128], and whereas the trilayer [127] [128] [129] is placed at one of the maxima of the electromagnetic field profile $\psi_k(z)$ of the mode it is designed to detect, and the current generated by the p-i-n photovoltaic inclusion is electrically insulated by the insulator parts [122] [123] of the inclusion. In all cases, the electrical current generated by the semiconductor part of the inclusion is brought to the connecting platform [6] by way of conduction lines [4] in contact with the metal parts of the metal-semiconductor-insulator inclusion [120] [121]. The same metal connections are also used to establish an electrical potential (e.g. a reverse bias) in the case of photovoltaic inclusions.

The conduction lines [4] can be in physical contact with the sidewalls of the pixels [5], or bond wired directly to the connecting platform [6]. Modal discrimination is best performed when the thickness of each metal-semiconductor-insulator inclusions is small, preferably smaller than one lobe of the electromagnetic field profile $\psi_k(z)$ of the mode it is designed to detect, which corresponds to half the wavelength of the mode in the cavity dielectric material. The invention is not restricted to a specific solid state scheme of detectivity or to a specific inclusion embodiment; the multi-spectral pixel can use photoconductive or photovoltaic inclusions whichever seems fit for one chosen application, and FIG. 3 depicts possible inclusion embodiments for the purpose of illustration only.

The optical cavity, by virtue of the resonance effect, increases locally the amplitude of the localized modes by a factor determined by the reflectivity of the latticed dielectric reflector structures [2] and by the capacity of the resonator to trap resonant light without loss. Such amplification of the electromagnetic field profile is related to the quality factor of the resonator, known in the art as Q-factor, thus providing enhanced sensitivity of optical detection. The metal-semiconductor-insulator inclusion, despite being thin, can have a high efficiency of light absorption and detection by virtue of their judicious location at one of the electric field maxima of a locally highly magnified eigenstate. The electric field maxima of the eigenstates are locally magnified in relation to the capacity of the resonator to trap resonant light without loss, which is related to the quality factor of the cavity. The quality factor of the resonator can be designed to be anywhere between 1 and 100 000 by an adjustment of the index difference between the low-index dielectric layer [30] and high-index dielectric layer [31], and by an adjustment of the total number of alternating layers in the stack. The quality factor is thus a design controllable parameter. Usually, the optical losses and scattering within the alternating layers will limit the Q-factor of the pixel to about 100 000. For most of the embodiments considered in this invention, a Q-factor between 10 and 1000 is usually considered appropriate. A high Q-factor will result in a more efficient light absorption by the inclusion and provide a finer spectral resolution for the resonant pixel.

Figure 4:
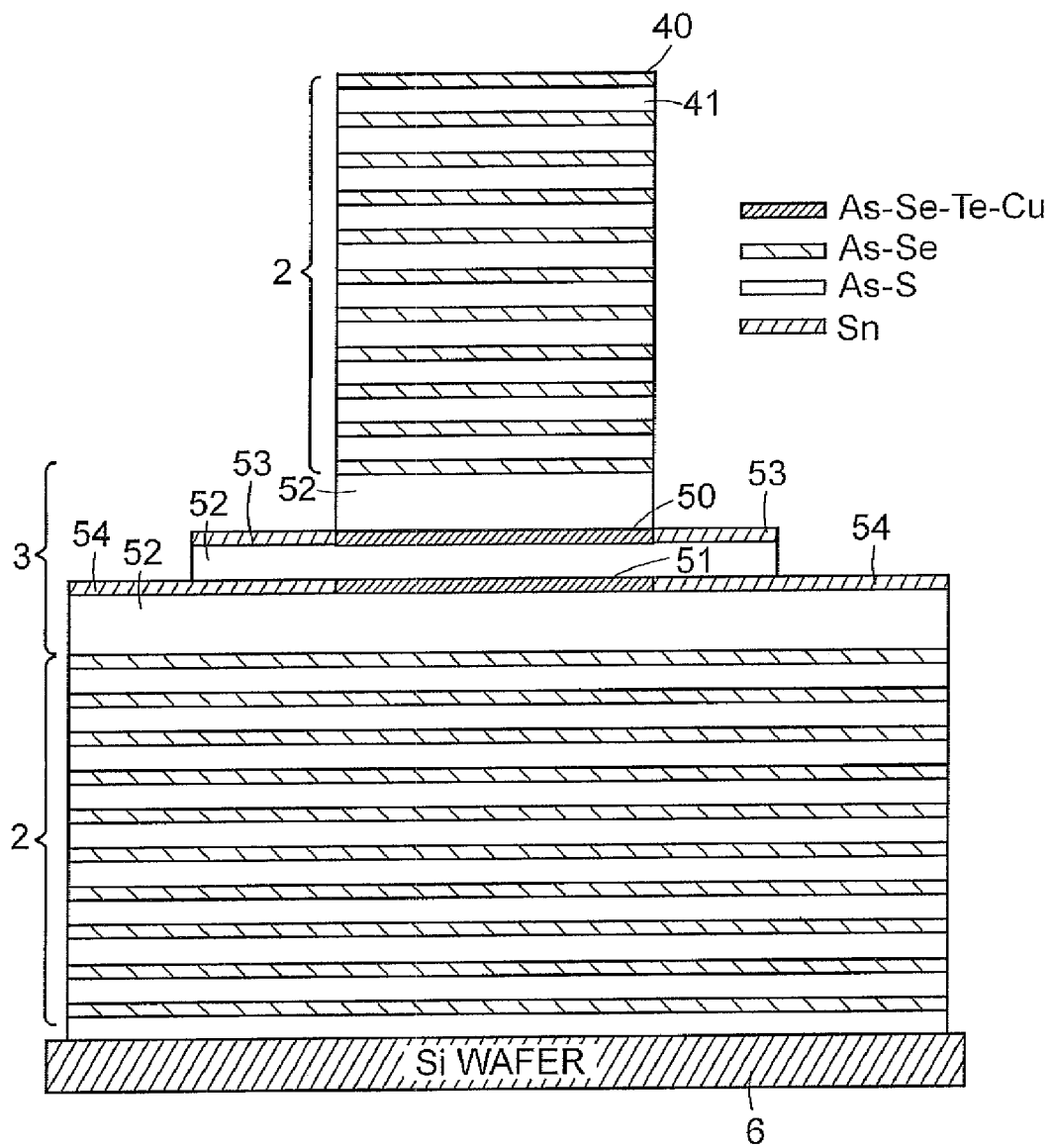
FIG. 4 is a schematic cross-section of a multi-spectral detection pixel with two detected optical frequencies.

One embodiment of a multi-spectral detection pixel in accordance with the invention is illustrated in FIG. 4. This embodiment has an optical cavity designed to support four localized resonant modes within the frequency range of the fundamental photonic bandgap, where two of the localized resonant modes are tapped and detected using metal-semiconductor-insulator inclusions. The pixel has two periodic latticed dielectric reflectors [2], made of alternating layers of high-index dielectric material [40] (e.g., As2Se3 glass, n=2.8) and low-index dielectric material [41] (e.g. As2S3, n=2.3), and one optical cavity [3] between the said latticed dielectric reflectors, made primarily of As2S3 glass material [52]. Two metal-semiconductor-insulator inclusions occupy the optical cavity [3].

The first inclusion includes a photoconductive As—Se—Te—Cu layer [50] (semiconductor part of the inclusion) electrically connected on each sides with tin metal electrodes [53] (metal part of the inclusion) and insulated from its neighbor inclusion by a cover of insulating As2S3 glass layers [52] (insulator part of the inclusion). The second inclusion includes a photoconductive As—Se—Te—Cu layer [51] (semiconductor part of the inclusion) electrically connected on each sides with tin metal electrodes [54] (metal part of the inclusion) and insulated from its neighbor inclusion by a sandwich of insulating As2S3 glass layers [52] (insulator part of the inclusion). In this particular embodiment, the As2S3 glass layers [52] act as the cavity material as well as the insulator material of the metal-semiconductor-insulator inclusions. The pixel is in direct contact with a silicon connecting platform [6], such as to form a monolithic multi-spectral pixel compatible to silicon CMOS fabrication lines.

Figure 5:
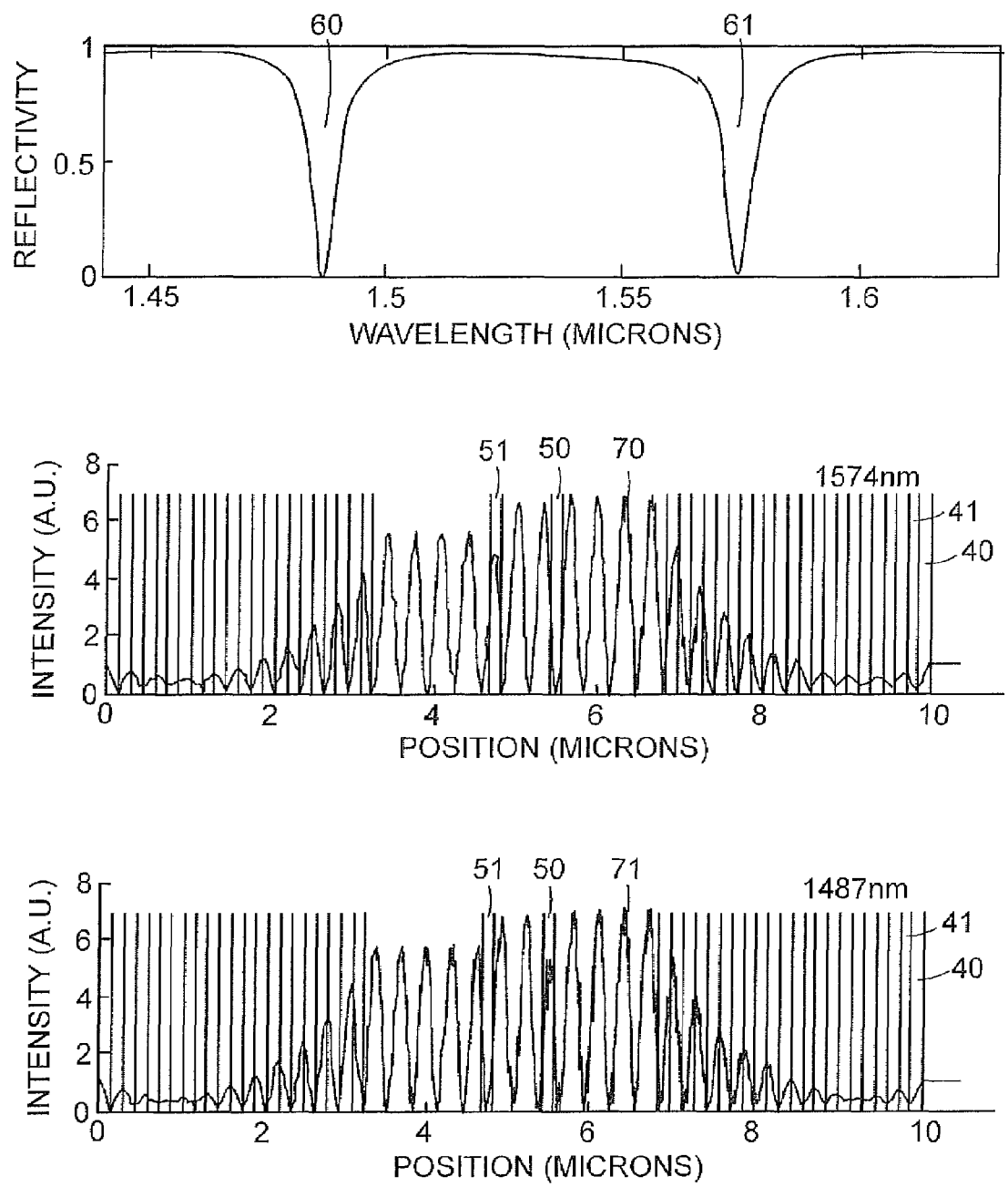
FIG. 5 are graphs showing the calculated spectral response at normal incidence of the multi-spectral pixel illustrated in FIG. 3, and the computed electromagnetic field profiles (eigenstates) of the two detected localized resonant modes.

FIG. 5 shows the spectral response at normal incidence of the multi-spectral detection pixel illustrated in FIG. 4. The 294 nm periodicity of the latticed dielectric reflectors [2], made of alternating layers of 135 nm As2Se3 glass [40] and 159 nm As2S3 glass [41], provides a fundamental photonic bandgap covering the wavelength range between 1400 nm and 1650 nm. The optical cavity provides a total of four resonant modes, wherein two resonant modes manifest themselves as non-reflected waves at wavelengths of 1487 nm [60] and 1574 nm [61]. The non-reflection of these modes come from the fact that the incident waves at these optical frequencies penetrate the top periodic latticed dielectric reflectors [2] of the pixel and excite the localized resonant modes shown in [71] and [70] respectively; the energy of these localized resonant modes being then absorbed by the As—Se—Te—Cu semiconductor part of the metal-semiconductor-insulator inclusions [50] and [51] respectively, and therefore unable to escape the pixel cavity [3] as reflection. Eigenstate [70] corresponds to an eigenvalue of wavelength 1574 nm, whereas eigenstate [71] corresponds to an eigenvalue of wavelength 1487 nm. All other incoming modes are reflected by the top latticed dielectric structure [2], such that the metal-semiconductor-insulator inclusions [50] [51] are blind to all modes except the localized resonant modes at wavelengths 1487 nm [60] and 1574 nm [61]. It can be seen that, by a judicious design of each respective layers of the pixel, the inclusion [50] can be positioned such that it overlaps maximally with the electromagnetic field of the 1487 nm localized resonant mode [71] and minimally with the electromagnetic field of the 1574 nm localized resonant mode [70], while the inclusion [51] can be positioned such that it overlaps maximally with the electromagnetic field of the 1574 nm localized resonant mode [70] and minimally with the electromagnetic field of the 1487 nm localized resonant mode [71].

Such optimal overlapping between the inclusions and the electromagnetic field amplitude maxima of the localized resonant modes improves optical detection and reduces detection crosstalk. Such detection scheme is based on the above mentioned modal discrimination of localized eigenstates, wherein the multi-spectral photodetection is determined by the uniqueness of the localized eigenstates. The As—Se—Te—Cu semiconductor part of the metal-semiconductor-insulator inclusions [50] and [51] is a semiconductor compound known to be photoconductive at the wavelengths of 1487 nm [60] and 1574 nm [61], therefore the material is able to perform optical-to-electrical signal conversion by way of photoconduction. By connecting the As—Se—Te—Cu layers [50] [51] with tin electrodes [53] [54] the inclusions can bring electrical signals to the connecting platform [6] with electrical currents commensurate with the optical intensity of the incident light at 1487 nm [60] and 1574 nm [61]. The micro-structure illustrated in FIG. 4 in accordance with the present invention can be used as a multi-spectral pixel, and scaled to a plurality of same identical pixels to form the focal plane array of a multi-spectral digital camera operating at near-infrared wavelengths of 1487 nm and 1574 nm.

Figure 6:
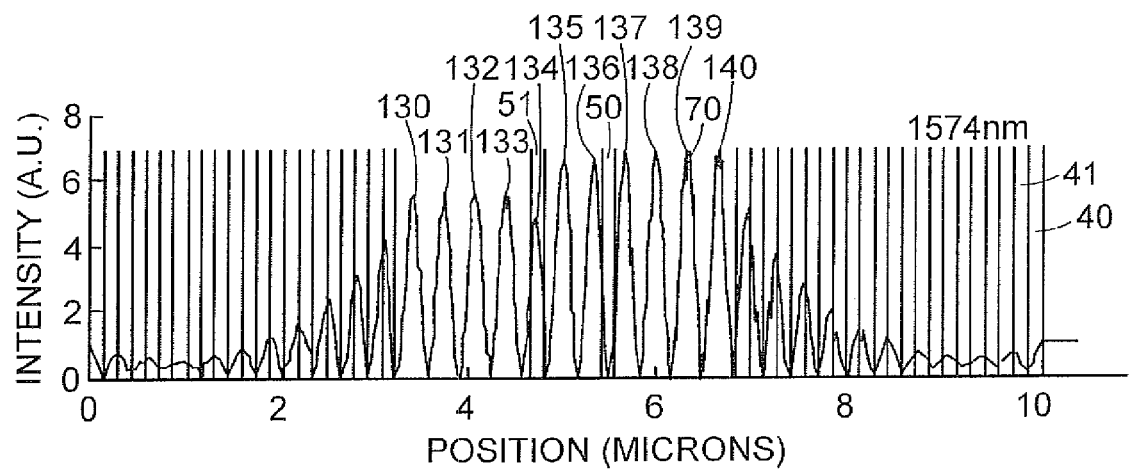
FIG. 6 are graphs showing locations of the metal-semiconductor-insulator inclusion for maximal detection of the first eigenstate and minimal detection of the second eigenstate, and the locations of the metal-semiconductor-insulator inclusion for maximal detection of the second eigenstate and minimal detection of the first eigenstate.
Figure 6:
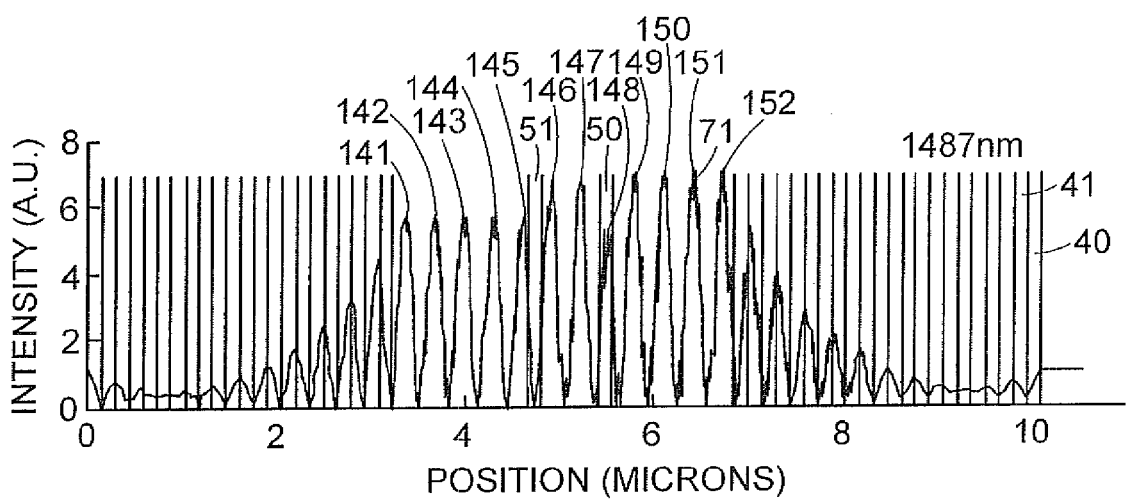

FIG. 6 shows that the pixel structure illustrated in FIG. 4 comprises a long optical cavity and the respective eigenstate comprises several maxima within this long cavity. The location of the metal-semiconductor-insulator inclusion [51] for maximal detection of eigenstate [70] is not restricted to the location shown in FIG. 5, but can be at any location where the eigenstate [70] is maximal and eigenstate [71] is minimal; this condition is achieved at locations [130] [131] [132] [133] [134] [135] [136] [137] [138] [139] and [140]. In addition, the location of the metal-semiconductor-insulator inclusion [50] for maximal detection of eigenstate [71] is not restricted to the location shown in FIG. 5, but can be at any location where the eigenstate [71] is maximal and eigenstate [70] is minimal; this condition is achieved at locations [141] [142] [143] [144] [145] [146] [147] [148] [149] [150] [151] and [152].

Method of Pixel Design:

Modal discrimination of localized eigenstates, wherein one specific eigenstate is maximally detected by one inclusion and all other eigenstates are minimally detected by the same inclusion, and similarly for the other inclusions, is a necessary aspect of the invention. Modal discrimination can be extended to more than two localized eigenstates within the same optical cavity. However, the condition of one eigenstate maximally detected by one inclusion and all other eigenstates minimally detected by the same inclusion can be difficult to achieve if the optical cavity supports more than five different eigenstates and designed to comprise more than five different inclusions. For such highly multi-spectral schemes, crosstalk could occur due to the fact that one inclusion may tap slightly a different eigenstate.

In order to avoid this problem, a design method that consists of mapping the magnitude distribution of eigenstate i as function of position inside the optical cavity, and comparing the map with a second map showing the combined magnitudes of all other eigenstates n, where n is different than i, can help in determining the optimal position of inclusion i inside the cavity, while minimizing crosstalk with the other eigenstates n. This design method consists of optimizing the ratio of magnitudes η between eigenstate i and the sum of eigenstates n $$\eta(z)=|\psi_i(z)|/\Sigma|\psi_n(z)| \quad (12)$$

and integrate η(z) over the thickness dz of the inclusion i. To obtain a good detection performance, it is generally preferable that this magnitude ratio be at least 10 or larger, such that the detection crosstalk is less than −10 dB. A design loop can be implemented wherein such crosstalk minimization method is taken into account in the overall design of the pixel structure.

In addition, modal discrimination can be improved not only by the judicious placement of the metal-semiconductor-insulator inclusion with respect to the eigenstates, as achieved by the crosstalk minimization method just described, but also by a judicious materials composition adjustment of the spectral absorption selectivity of the inclusion. Even if there is non-negligible field overlap between inclusion i and eigenstates n, the detection crosstalk can be minimized by adjusting the material composition of the semiconductor part of inclusion i such that the optical absorption is minimal at the frequencies of eigenstates n, resulting in minimal photoconductive or photovoltaic effects at the frequencies of eigenstates n. The spectral distribution is an important characteristic of photoconductivity and photovoltaic effects as it expresses the frequency dependence of the basic processes of generation, transport and recombination of excess charge carriers on the excitation photon energy. The spectral distribution of photoconductivity and photovoltaic effects depends particularly on the composition of the inclusion semiconductor material, and to a lesser extent on the conditions of preparation of the thin films, the temperature, the strength and polarity of the applied electric field and intensity of excitation light.

An inclusion placed optimally on the field maxima of one of the localized resonant modes may interact with the other localized resonant modes as well, thus generating an unacceptable level of electrical crosstalk. However, the wide wavelength difference between the resonant localized modes (i.e., visible vs. infrared wavelength regimes) provides the benefit that the respective inclusions may not show any photoconductive or photovoltaic effect at any modes other than the one the material composition of the inclusion is designed for, thus lowering electrical detection crosstalk between the modes.

Modal discrimination can be improved not only by an optimal placement of the metal-semiconductor-insulator inclusion with respect to the eigenstates, but also by a judicious materials composition adjustment of the spectral absorption selectivity of each inclusion. The material composition of the inclusion can be adjusted such that the photoconductive or photovoltaic effect is optimal only at the frequency of one localized resonant mode. It is known, for instance, that the photoconductive As—Se—Te—Cu semiconductor alloy has a photoconductive spectral response dependent on the Te and Cu molar concentrations, such that for example high Te and Cu molar concentrations work best only for long-infrared wavelengths, and the low Te and Cu molar concentrations work best only for near-infrared wavelengths.

The crosstalk minimization method for the design of multi-spectral detection pixels based on modal discrimination of localized eigenstates thus involves a procedure comprising 1) the positioning of a metal-semiconductor-insulator inclusion for maximal field overlap with respect to a single localized Bloch mode inside the pixel's cavity, and 2) the positioning of the same said metal-semiconductor-insulator inclusion for minimal field overlap with respect to the plurality of different localized Bloch modes inside the pixel's cavity, and 3) the material compositional adjustment of the same said metal-semiconductor-insulator inclusion for maximal optical absorption of the same said single localized Bloch mode inside the pixel's cavity, and 4) the material compositional adjustment of the same said metal-semiconductor-insulator inclusion for minimal optical absorption of the same said plurality of different localized Bloch modes inside the pixel's cavity. This procedure is repeated iteratively for all other metal-semiconductor-insulator inclusions inside the pixel's optical cavity.

Figure 7:
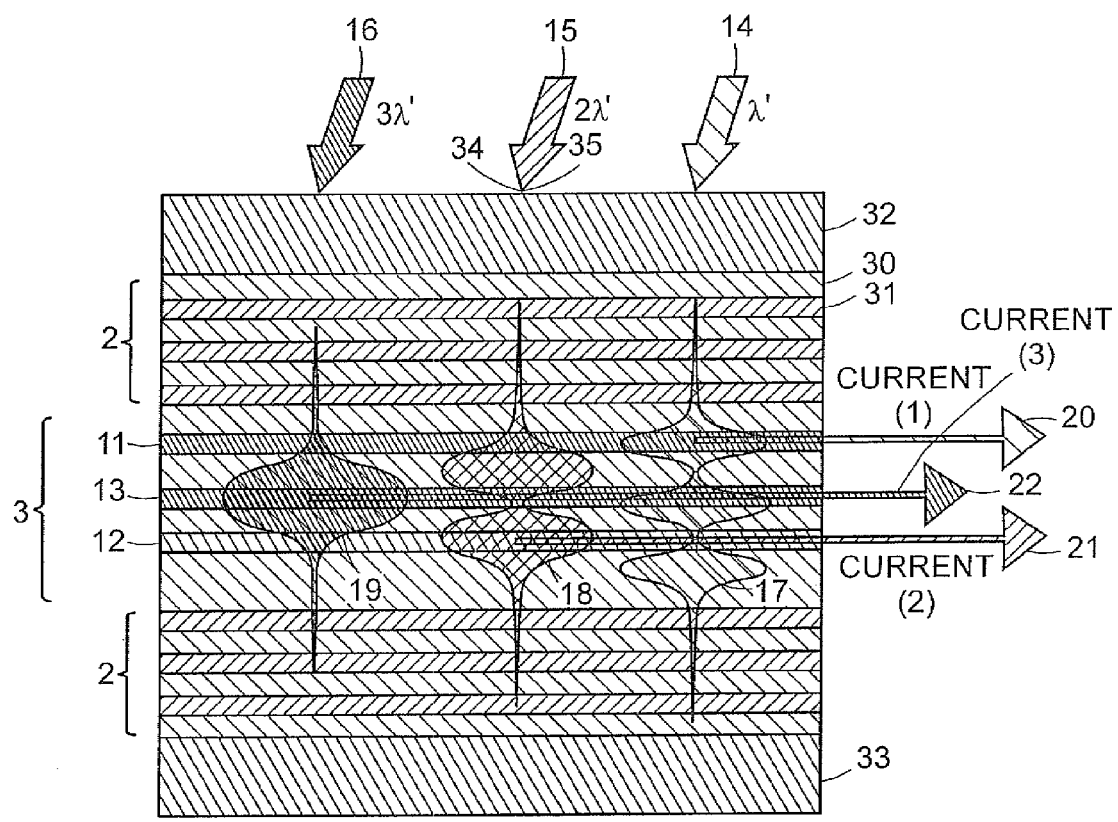
FIGS. 7 and 8 are schematic cross-sections of a tunable multi-spectral detection pixel illustrated in FIG. 1, with three detected optical frequencies.

The spectral response of the pixel can be changed, or tuned, in frequency. The frequency-tuning mechanism of the multi-spectral detection pixel relies on an adjustment of the angle between the surface normal of the pixel and the pointing vector of the incident illumination. FIG. 7 illustrates the cross-section of the proposed tunable multi-spectral detection pixel, with three detected optical frequencies. The incoming illumination pointing-vector [35] is incident at a non-zero angle with respect to the surface normal [34] of the pixel. The pointing-vector of the incoming illumination corresponds to the spatial direction of travel of the incoming illumination light, and the surface normal is the axis perpendicular to the pixel's top surface.

The refractive index of the extremity layer [32] determines the incident angle between the illumination pointing-vector inside the extremity layer with respect to the surface normal of the periodic latticed reflector structure [2]. The refractive index of the extremity layers [32] is preferably the same as the other extremity layer [33] to insure a refractive index symmetry in the overall pixel dielectric stack [32] [2] [3] [2] [33] and to minimize radiation loss of the localized resonant modes. The effect of the angle adjustment is to change the conditions of constructive interference at the interface between layers [32] and [30] and to tune the resonant modes from λ to λ', from 2λ to 2λ', and from 3λ to 3λ' as compared to the modes illustrated in FIG. 2, which are generated from illumination at zero-angle incidence.

Figure 8:
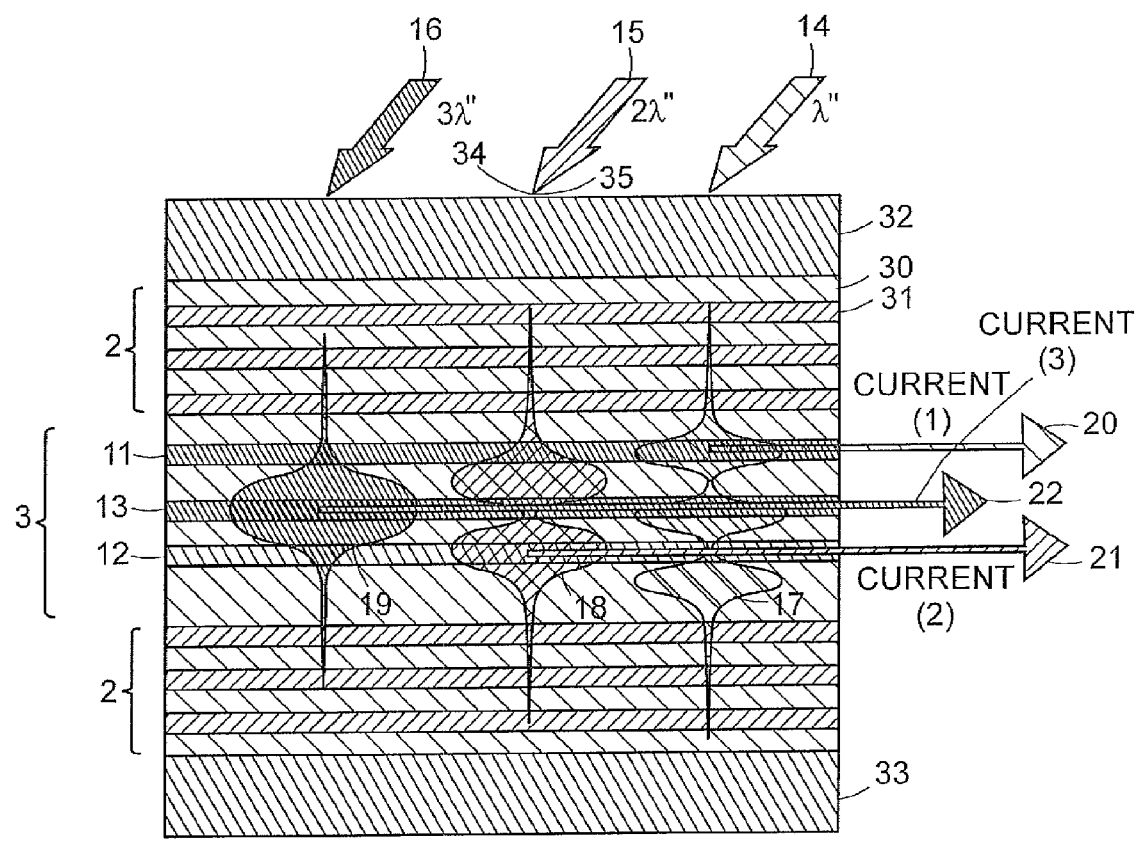

FIG. 8 illustrates the cross-section of the proposed tunable multi-spectral detection pixel, with three detected optical frequencies. The incoming illumination pointing-vector [35] is incident at a larger non-zero angle with respect to the surface normal [34] of the pixel. In this case, the effect of the angle adjustment is to tune the resonant modes from λ to λ", from 2λ to 2λ", and from 3λ to 3λ" as compared to the modes illustrated in FIG. 2, which are generated from illumination at zero-angle incidence.

Typically, the incoming illumination pointing-vector [35] can be incident at a range of angles from 0 to 75 degrees with respect to the surface normal [34] of the pixel. As the incidence angle is increased continually from zero-angle to a moderate-angle to a large-angle, the wavelength of the resonant modes is shifted continually from λ to λ' to λ", and from 2λ to 2λ' to 2λ", and from 3λ to 3λ' to 3λ", with a characteristic blue-shifting, or diminution, or lower wavelength tuning, of the resonant wavelengths due to the interference effect outside the periodic latticed structure [2]. The characteristic blue-shifting of the resonant wavelength tuning takes the mathematical form λ>λ'>λ", and 2λ>2λ'>2λ", and 3λ>3λ'>3λ".

The extremity layers [32] [33] can also be a stack of dielectric layers, such as a periodic latticed reflector structure, with a characteristic periodicity length of the lattice different than the characteristic periodicity length of the previously described periodic latticed reflector structure [2]. An exemplary purpose of the latticed extremity layer stack [32] [33] is to open additional bandgaps at frequencies different than the bandgaps of the periodic latticed reflector structure [2], and thus to provide added reflection and rejection of undesired non-resonant modes that might otherwise be transmitted into the optical cavity of the pixel.

Figure 9:
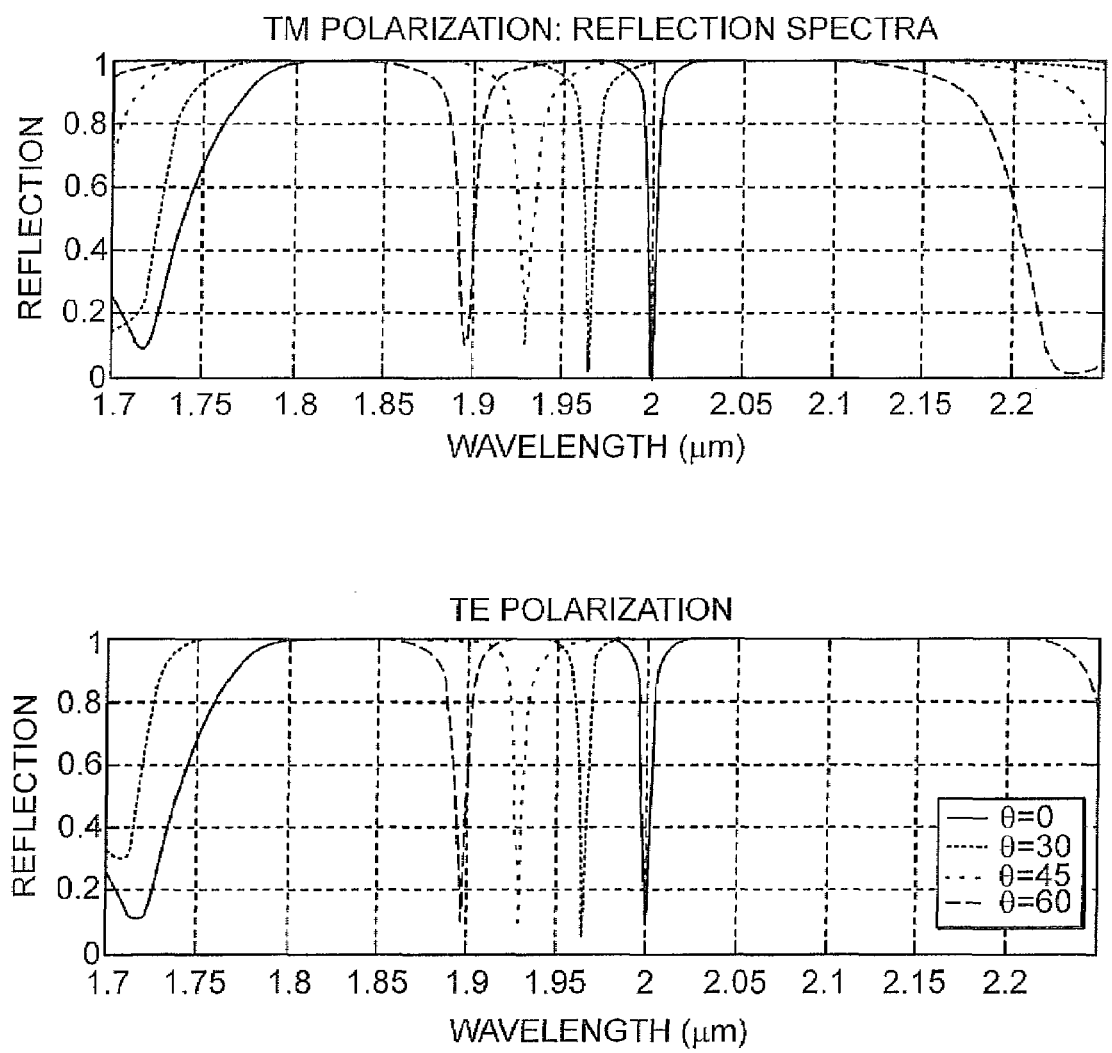
FIGS. 9 and 10 are graphs showing the calculated TM and TE spectral response of tunable multi-spectral detection pixels.

FIG. 9 shows the calculated TM and TE spectral response of a tunable multi-spectral detection pixel having extremity layers [32] [33] of refractive index of n=1.44. In this exemplary embodiment, the wavelength of the resonant mode is tuned from 2.0 µm (0 degree angle incidence), to 1.96 µm (30 degree angle incidence), to 1.93 µm (45 degree angle incidence), and to 1.895 µm (60 degree angle incidence). The polarization dependence of the wavelength-tuning is generally small over this range of angles.

Figure 10:
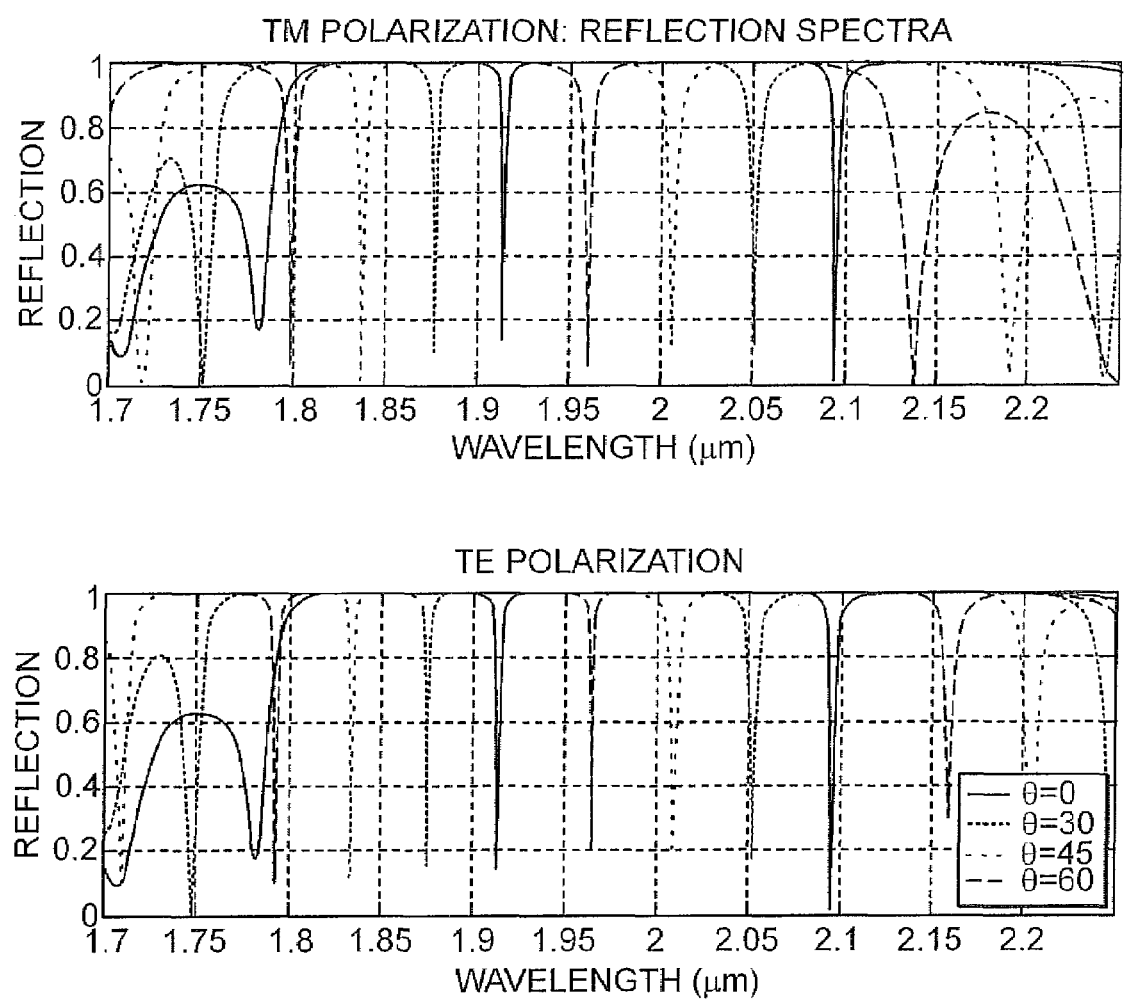

FIG. 10 shows that the abovementioned method of frequency-tuning of the resonant modes is also applicable to an optical cavity comprising a larger number of resonant modes, which corresponds to an optical cavity having a larger density of states inside the photonic bandgaps. The wavelength of all the resonant modes of the optical cavity can be tuned, or blue-shifted, with respect to an increase of the angle between the incoming illumination pointing-vector [35] and the surface normal [34] of the pixel. The resonant wavelengths shown in FIGS. 9 and 10, and the amplitudes of frequency-tuning, are not restricted to these particular values; the particular embodiment used in FIGS. 9 to 10 has been chosen by way of illustration only and is not representative of any restrictions in the invention. In the exemplary embodiments, the refractive index of the two extremity layers [32] [33] are the same, and the thickness of the two extremity layers [32] [33] are larger than the wavelength of the resonant modes.

Figure 11:
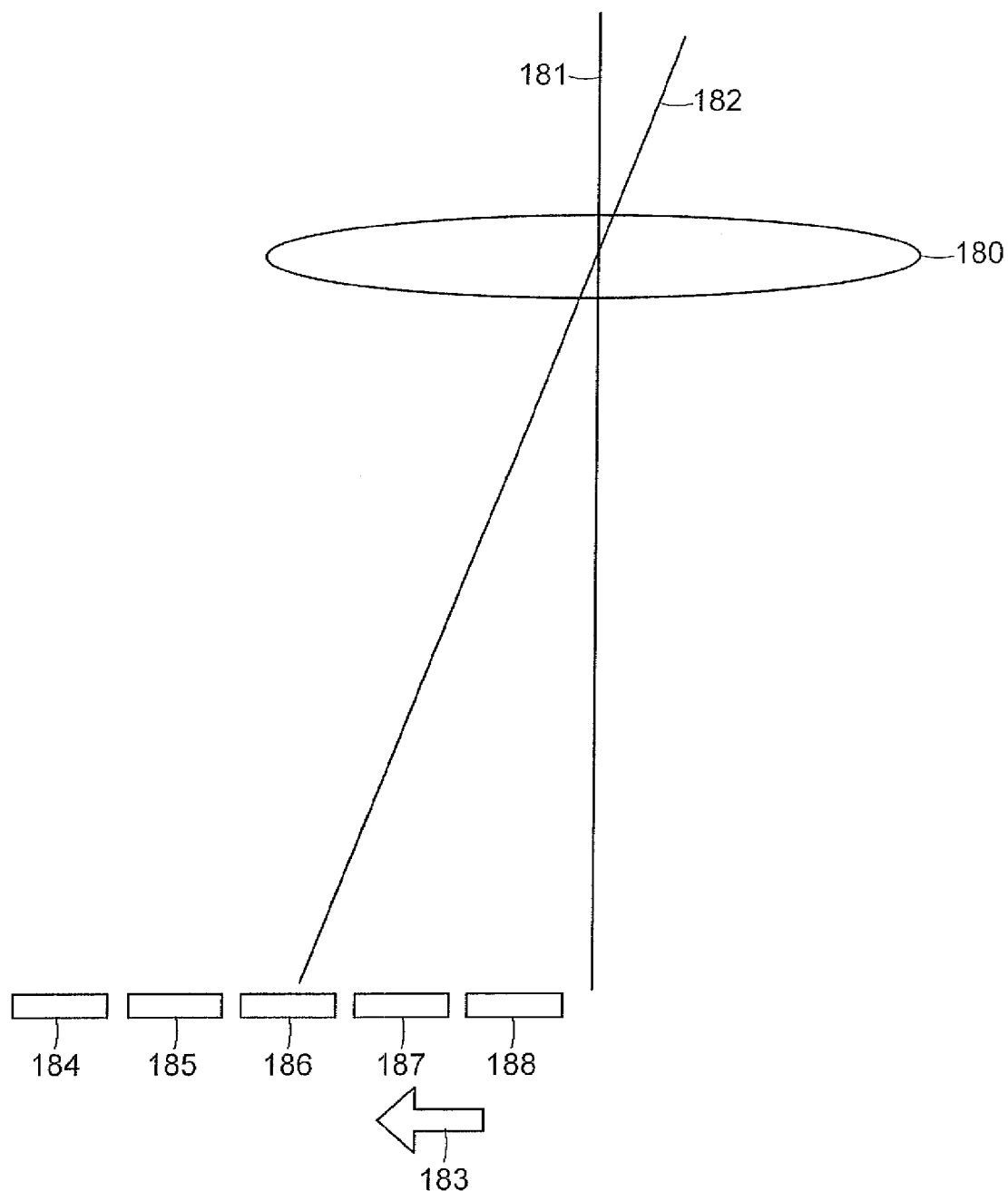
FIG. 11 is a schematic diagram of the angular frequency-tuning scheme of the pixel, achieved by the translation of the whole focal plane array with respect to the optical axis of the lens system.

The spectral response of the focal plane array can be frequency-tuned by using three different tuning methods; 1) translation of the whole focal plane array, or 2) rotation of every individual pixel, or 3) rotation of the whole focal plane array. FIG. 11 illustrates the method of tuning the spectral response of the focal plane array by the translation of the whole focal plane array. This method consists of translating by a vector [183] the focal plane array illustrated by pixels [184] [185] [186] [187] and [188]. The translation [183] is done perpendicular with respect to the optical axis [181] of the objective lens system [180] of the camera. The translation creates an angle between the incoming incident light [182] and the surface normal of the focal plane array, which stays parallel to the axis of the lens system [181]. The range of angles is typically between 0 degree and 75 degrees, and can be achieved by mounting the focal plane array on a translation stage. In this illustration, the size of the pixels and the size of the focal plane array have been magnified to help visualize the translation method.

Figure 12:
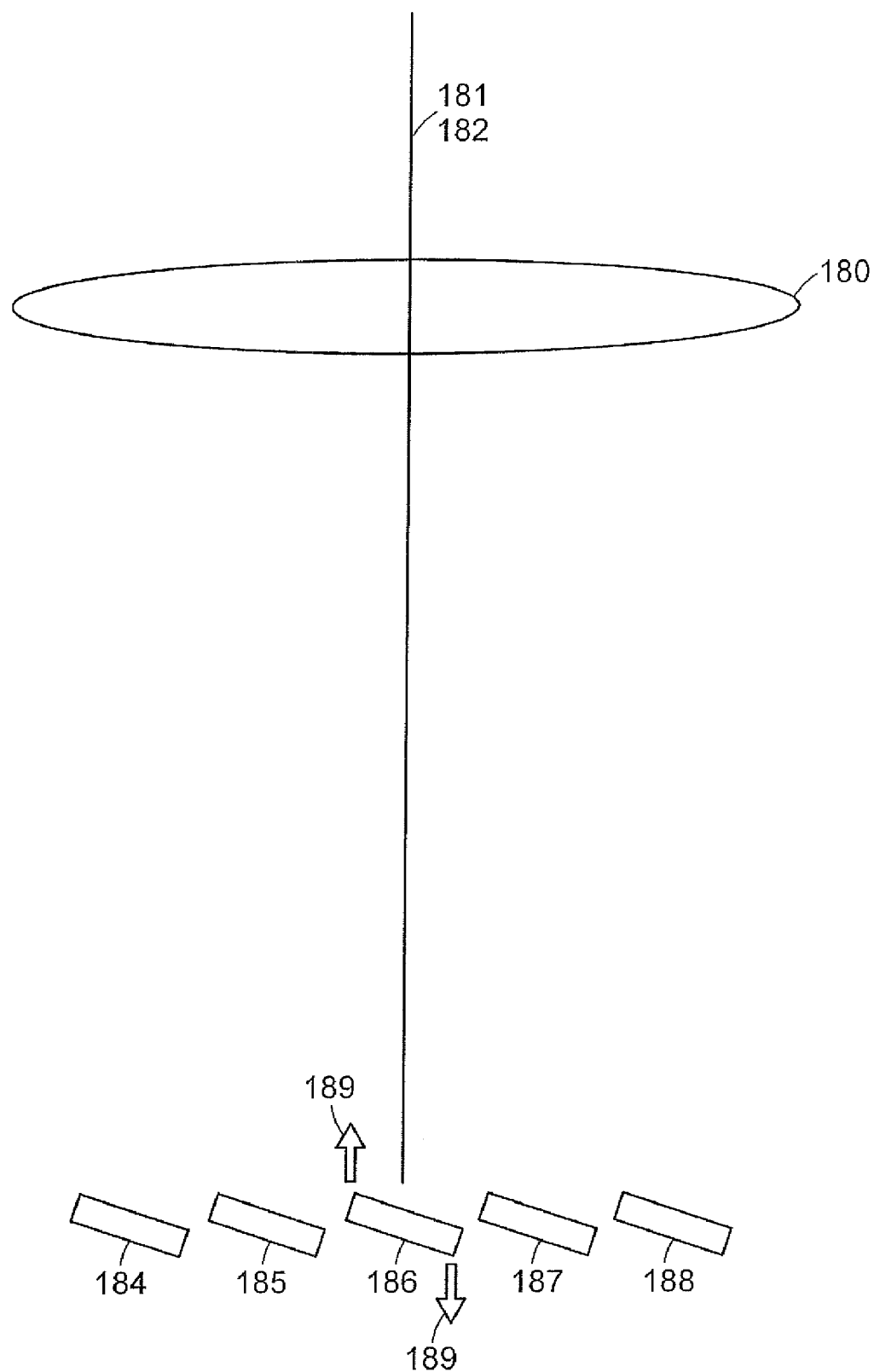
FIG. 12 is a schematic diagram of the angular frequency-tuning scheme of the tunable multi-spectral pixel, achieved by an angle adjustment of every pixels of the focal plane array with respect to the optical axis of the lens system.

FIG. 12 illustrates the method of tuning the spectral response of the focal plane array by the rotation of every individual pixels of the focal plane array. This method consists of rotating every individual pixels [184] [185] [186] [187] and [188] by a same angle represented by the vectors [189]. The rotations create an angle between the incoming incident light [182] and the surface normal [34] of every pixels of the focal plane array. In this case the incoming incident light [182] stays parallel to the axis [181] of the lens system [180]. The range of angles is typically between 0 degree and 75 degrees, and can be achieved by mounting every individual pixels on small micro-electromechanical actuators, such as MEMS. In this illustration, the size of the pixels and the size of the focal plane array have been magnified to help visualize the pixel rotation method.

Figure 13:
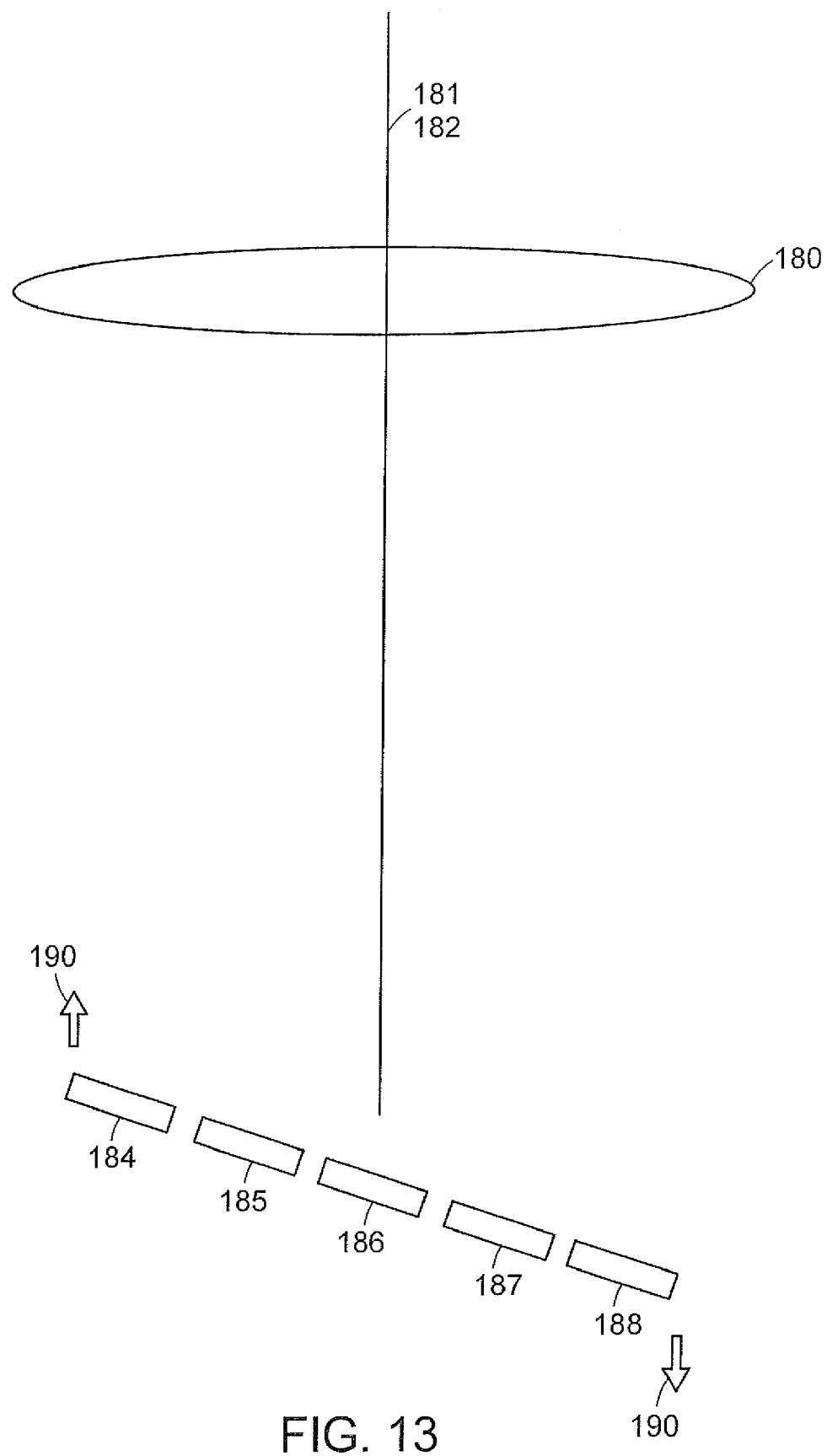
FIG. 13 is a schematic diagram of the angular frequency-tuning scheme of the tunable multi-spectral pixel, achieved by an angle adjustment of the whole focal plane array with respect to the optical axis of the lens system.

FIG. 13 illustrates the method of tuning the spectral response of the focal plane array by the rotation of the whole focal plane array. This method consists of rotating by a vector [190] the focal plane array illustrated by pixels [184] [185] [186] [187] and [188]. The rotation axis is perpendicular to the optical axis [181] of the objective lens system [180] of the camera. The rotation creates an angle between the incoming incident light [182] and the surface normal of every pixels [34]. The range of angles is typically between 0 degree and 75 degrees, and can be achieved by mounting the focal plane array on a rotation stage. In this illustration, the size of the pixels and the size of the focal plane array have been magnified to help visualize the rotation method. For all the abovementioned methods, the focal plane array of the camera is rendered frequency-tunable because the multi-spectral detection pixels have a surface normal [34] adjusted at a controllable angle with respect to the incident light [35] on the said pixels, and that this angle can be tuned in a controllable way, thus rendering every multi-spectral detection pixels frequency-tunable.

Figure 14:
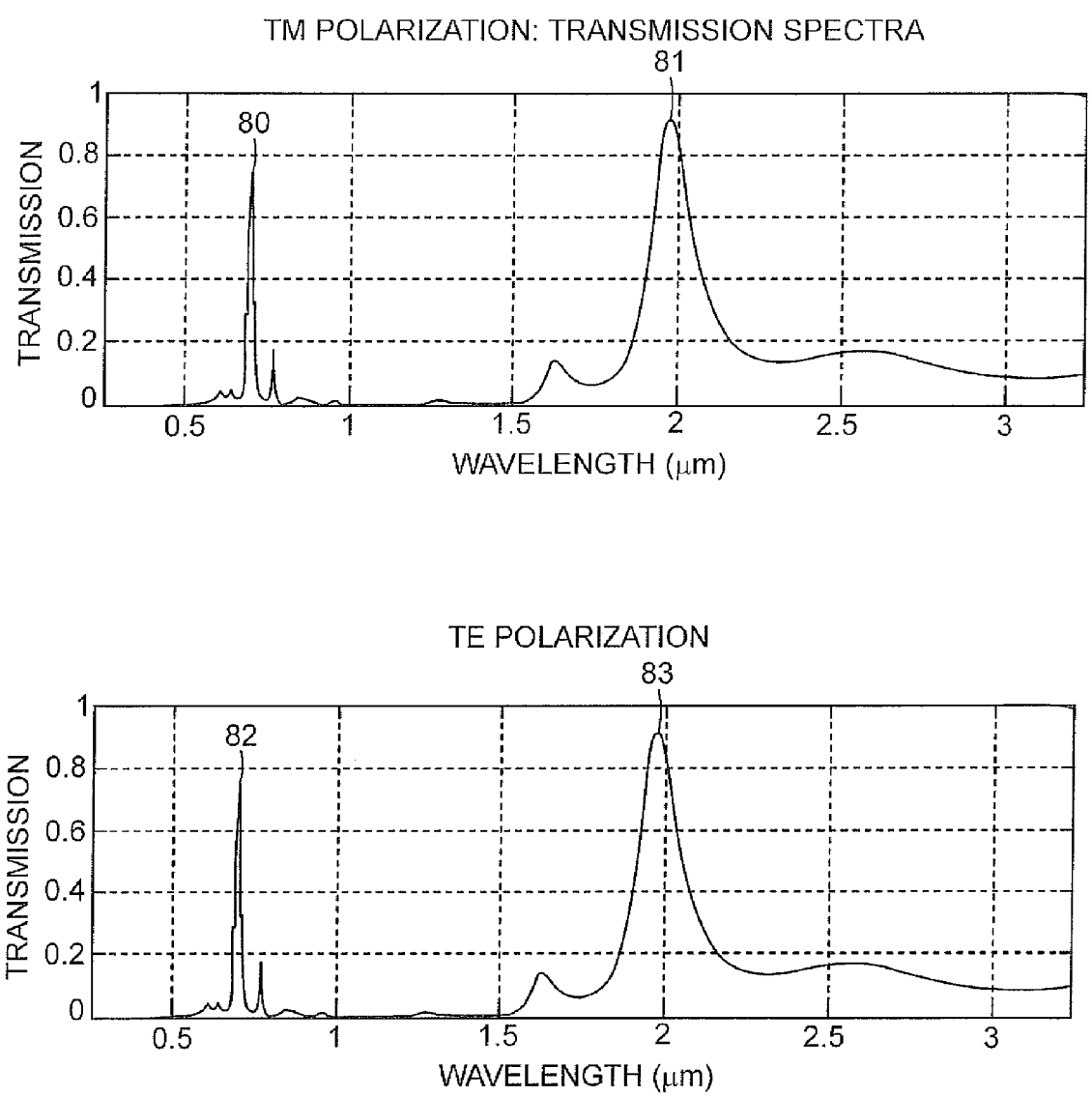
FIG. 14 are graphs of showing the calculated TM and TE spectra of light transmitted into the optical cavity of an exemplary low-Q-factor embodiment of a pixel combining visible and infrared detection.

FIG. 14 shows the calculated TM and TE spectra of light transmitted into the optical cavity of an exemplary low-Q-factor embodiment of a pixel combining visible and infrared detection. The embodiment is made of periodic latticed reflector structure [2] having one 312 nm layer of SiO2 and one 120 nm layer of amorphous silicon, and one 624 nm SiO2 optical cavity. In addition, the embodiment is capped by a latticed extremity layer stack [32] made of four 156 nm SiO2 plus 60 nm silicon layers, and two 78 nm SiO2 plus 55 nm Si3N4 layers. Two resonant modes appear at 680 nm (visible) and at 1900 nm (infrared). The 680 nm resonant mode is degenerated into a TM polarization [80] and TE polarization [82] modes, while the 1900 nm resonant mode is degenerated into a TM polarization [81] and TE polarization [83] modes. The pixel is essentially blind at all wavelengths except these localized resonant modes at frequencies 680 nm and 1900 nm.

Figure 15:
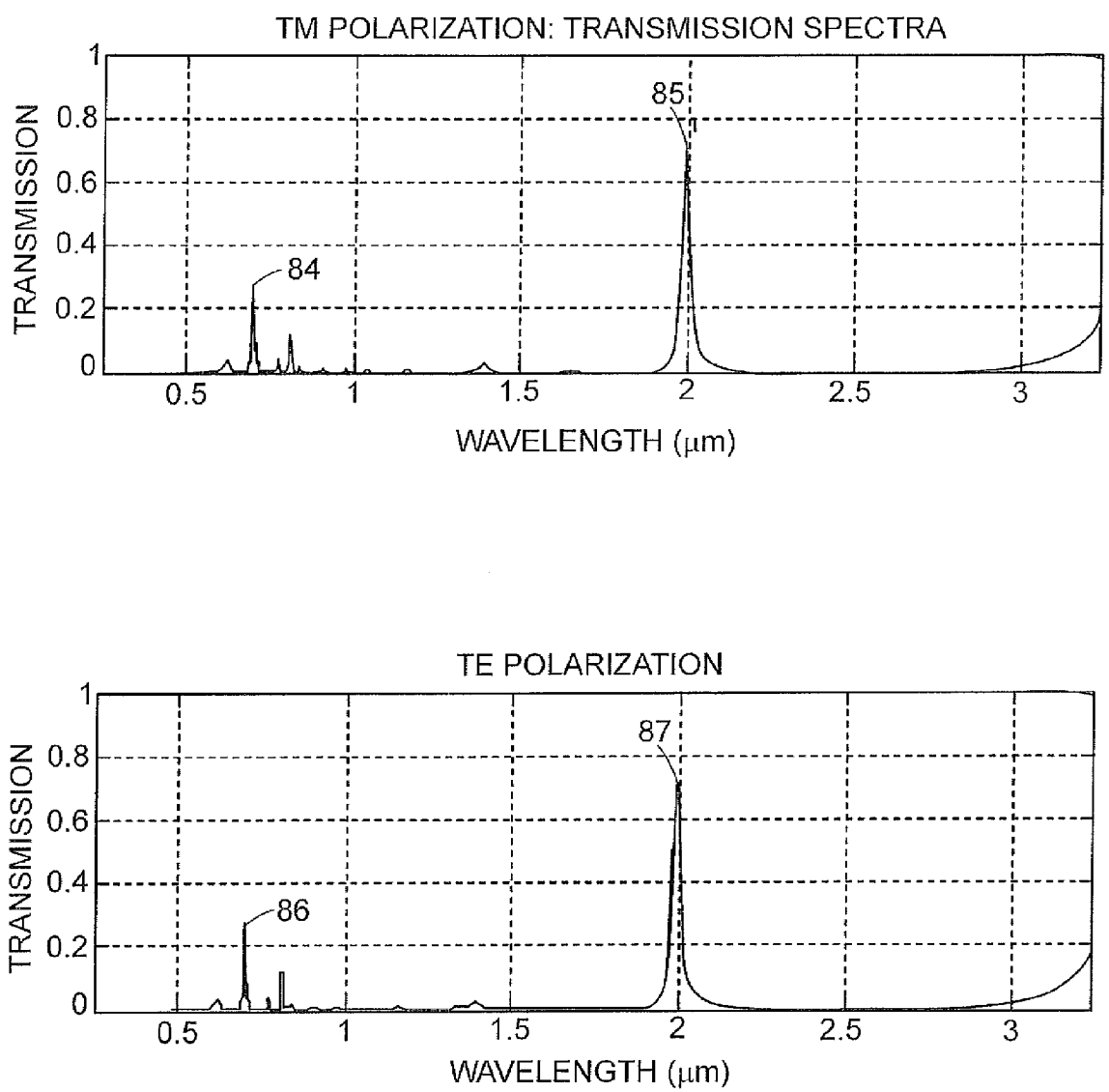
FIG. 15 are graphs showing the calculated TM and TE spectra of light transmitted into the optical cavity of an exemplary high-Q-factor embodiment of a pixel combining visible and infrared detection.

FIG. 15 shows the calculated TM and TE spectra of light transmitted into the optical cavity of an exemplary high-Q-factor embodiment of a pixel combining visible and infrared detection. The embodiment is essentially the same as the embodiment described for FIG. 15, except that the periodic latticed reflector structure [2] has two 312 nm layer of SiO2 and two 120 nm layer of amorphous silicon, providing an higher efficiency of trapping of light into the optical cavity and increasing the Q-factor of the pixel. Two resonant modes appear at 680 nm (visible) and at 2000 nm (infrared). The 680 nm resonant mode is degenerated into a TM polarization [84] and TE polarization [86] modes, while the 2000 nm resonant mode is degenerated into a TM polarization [85] and TE polarization [87] modes. The pixel is essentially blind at all wavelengths except for these localized resonant modes at frequencies 680 nm and 2000 nm.

Figure 16:
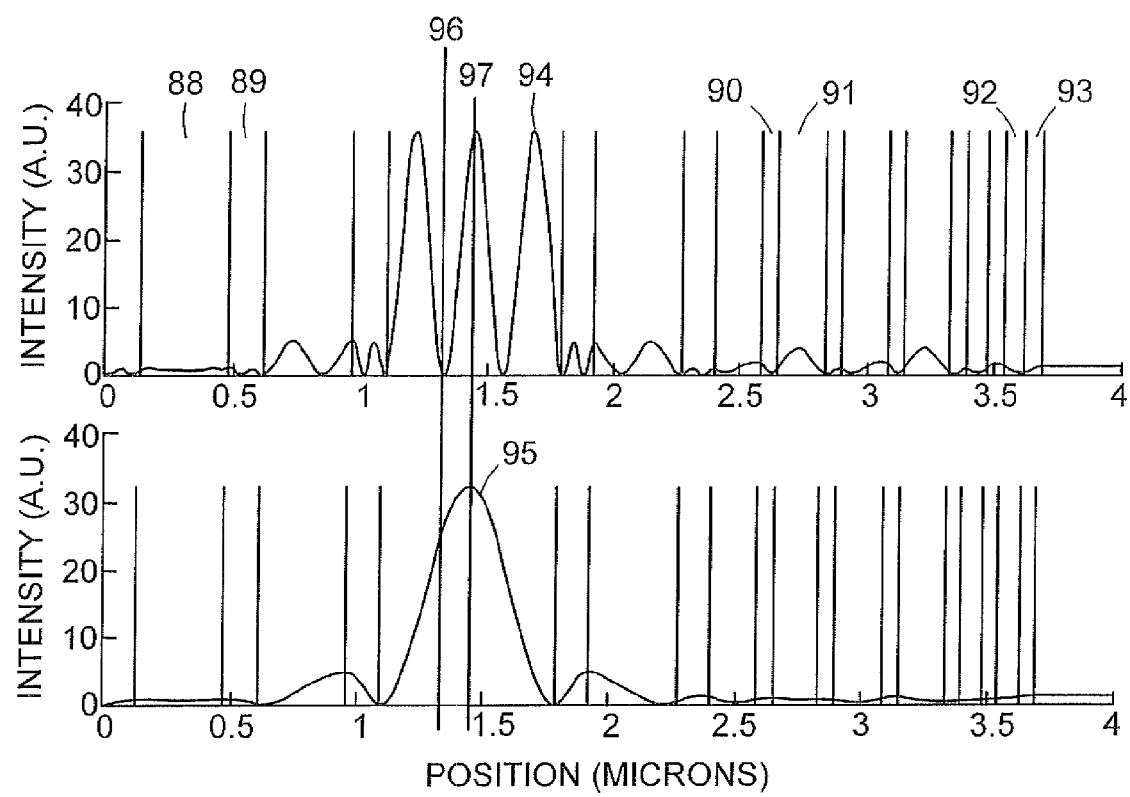
FIG. 16 are graphs showing the calculated TM and TE eigenstates of the high-Q-factor embodiment of a pixel combining visible and infrared detection of FIG. 15.

FIG. 16 shows the calculated TM and TE eigenstates of the high-Q-factor embodiment of FIG. 15. The two localized resonant modes at 680 nm (visible, top plot) and 2000 nm (infrared, bottom plot) have respective eigenstate profiles shown at [94] and at [95]. It can be seen that one exemplary optimal placement of the metal-semiconductor-insulator inclusions for multi-spectral detection is [97] for the detection of the 680 nm eigenstate (inclusion made of silicon insensitive to 2000 nm infrared light) and [96] for the detection of 2000 nm eigenstate (inclusion made of $As_{30}Se_{15}Te_{45}Cu_{10}$ sensitive to 2000 nm infrared light). The placement of the inclusions is determined according to the abovementioned crosstalk minimization method, and it takes into account that the inclusion designed to detect the 680 nm mode has a semiconductor part made of silicon, which is photosensitive at 680 nm visible light but insensitive at 2000 nm infrared light, while the inclusion designed to detect the 2000 nm mode has a semiconductor part made of a material such as $As_{30}Se_{15}Te_{45}Cu_{10}$, which is an amorphous compound known to be photosensitive at 2000 nm infrared light.

FIG. 16 further illustrates that the high-Q-factor embodiment is made of periodic latticed reflector structure [2] having two 312 nm layer of SiO2 (one of them is pointed at [88]) and two 120 nm layer of amorphous silicon (one of them is pointed at [89]), and one 624 nm SiO2 optical cavity. In addition, the embodiment is capped by a latticed extremity layer stack [32] made of four 156 nm SiO2 (one of them is pointed at [91]) plus 60 nm silicon layers (one of them is pointed at [90]), and two 78 nm SiO2 (one of them is pointed at [92]) plus 55 nm Si3N4 layers (one of them is pointed at [93]). This embodiment can be used for a multi-spectral focal plane array designed to detect two different optical frequencies combining visible and infrared optical regimes.

Figure 17:
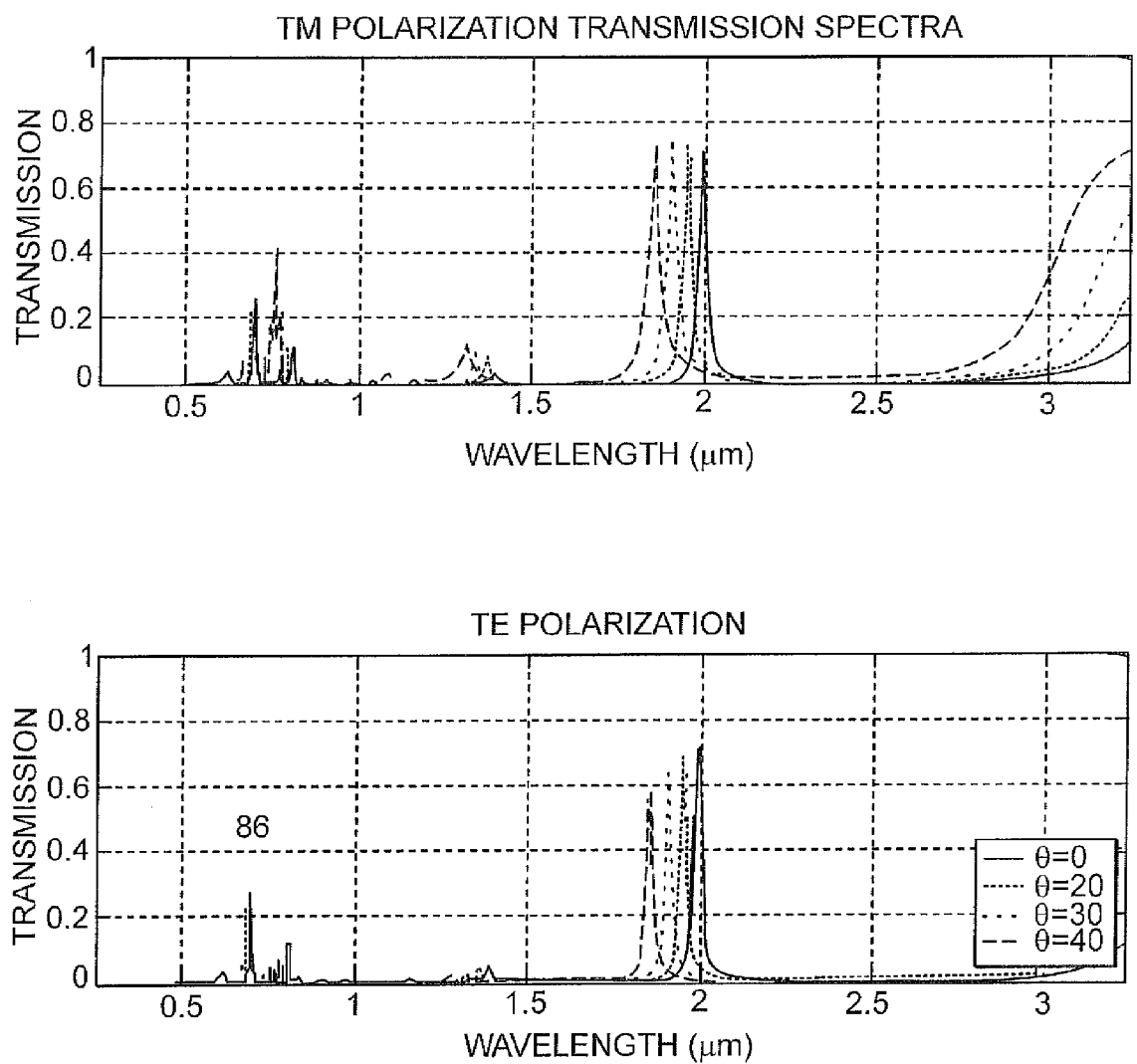
FIG. 17 are graphs showing the calculated TM and TE spectra of light transmitted into the optical cavity of an exemplary high-Q-factor embodiment of a pixel combining visible and infrared detection in accordance with the spectra of FIG. 15 and the eigenstates of FIG. 16.

FIG. 17 shows the calculated TM and TE spectra of light transmitted into the optical cavity of the same exemplary high-Q-factor embodiment of a pixel combining visible and infrared detection in accordance with the spectra of FIG. 15 and the eigenstates of FIG. 16. Two resonant modes appear at 680 nm (visible) and at 2000 nm (infrared) and both modes can be blue-shifted with a change of the incidence angle. In this exemplary embodiment, the wavelength of the 2000 nm resonant mode is tuned from 2000 nm (0 degree angle incidence), to 1930 nm (20 degree angle incidence), to 1870 nm (30 degree angle incidence), and to 1800 nm (40 degree angle incidence) by adjusting the angle between the incident light [35] and the surface normal of the pixel [34], as explained in the abovementioned method of frequency-tuning of the spectral response of the pixels.

Figure 18:
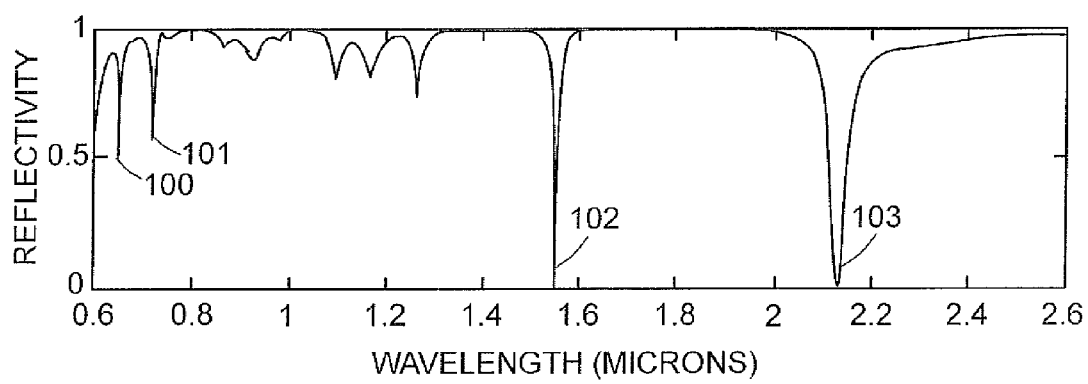
FIG. 18 is a graph showing the calculated TE reflection spectra of an exemplary high-Q-factor embodiment of a pixel combining visible and infrared detection, with an optical cavity having two times the density of states compared to the embodiment of FIG. 15.

FIG. 18 shows the calculated TM and TE reflection spectra of an exemplary high-Q-factor embodiment of a pixel combining visible and infrared detection. The embodiment is made of periodic latticed reflector structure [2] having two 312 nm layer of SiO2 and two 120 nm layer of amorphous silicon, and one 1248 nm SiO2 optical cavity. In addition, the embodiment is capped by a latticed extremity layer stack [32] made of five 156 nm SiO2 plus 60 nm silicon layers, and two 78 nm SiO2 plus 55 nm Si3N4 layers.

This exemplary embodiment is almost the same as the embodiment shown in FIG. 16, except that the optical cavity is longer by a factor of two. The physical increase of the length of the optical cavity leads to an increase of the density of states inside the photonic bandgaps of the pixel, and to an increase of the number of localized resonant Bloch modes inside the cavity. This exemplary embodiment has four localized resonant modes inside the optical cavity, with respective optical wavelengths of 670 nm (visible), 720 nm (near-infrared), 1550 nm (near-infrared) and 2130 nm (mid-infrared). Almost all the light incident on the pixel is reflected away and do not penetrate into the optical cavity, except at the resonant wavelengths of 670 nm (visible), 720 nm (near-infrared), 1550 nm (near-infrared) and 2130 nm (mid-infrared), such that the multi-spectral detection of this exemplary pixel comprises visible, near-infrared and mid-infrared modes.

Figure 19:
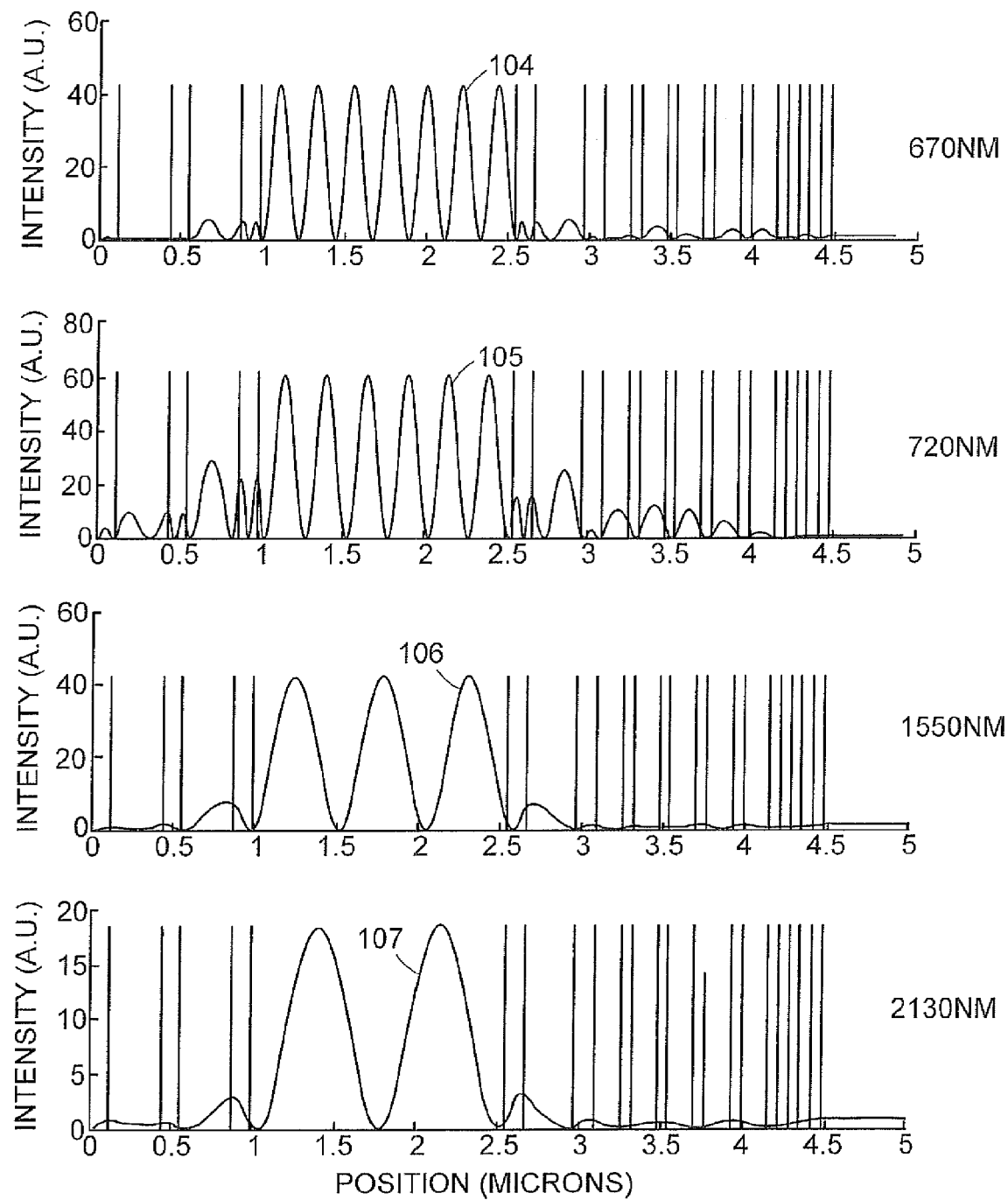
FIG. 19 are graphs showing the calculated eigenstates of the exemplary high-Q-factor embodiment of a pixel combining visible and infrared detection of FIG. 18.

The electromagnetic mode profiles, or eigenstates, of the four resonant modes are depicted in FIG. 19. In this exemplary embodiment, the visible 670 nm localized resonant mode is pointed in [104], the visible 720 nm localized resonant mode is pointed in [105], the near-infrared 1550 nm localized resonant mode is pointed in [106], and the mid-infrared 2130 nm localized resonant mode is pointed in [107].

All the eigenstates are localized maximally at, and minimally away from, the optical cavity of the pixel. The metal-semiconductor-insulator inclusions (not shown) can be placed in accordance with the scheme of modal discrimination of localized eigenstates and using the abovementioned crosstalk minimization method. This embodiment can be used for a multi-spectral focal plane array designed to detect four different optical frequencies combining visible and infrared optical regimes.

Figure 20:
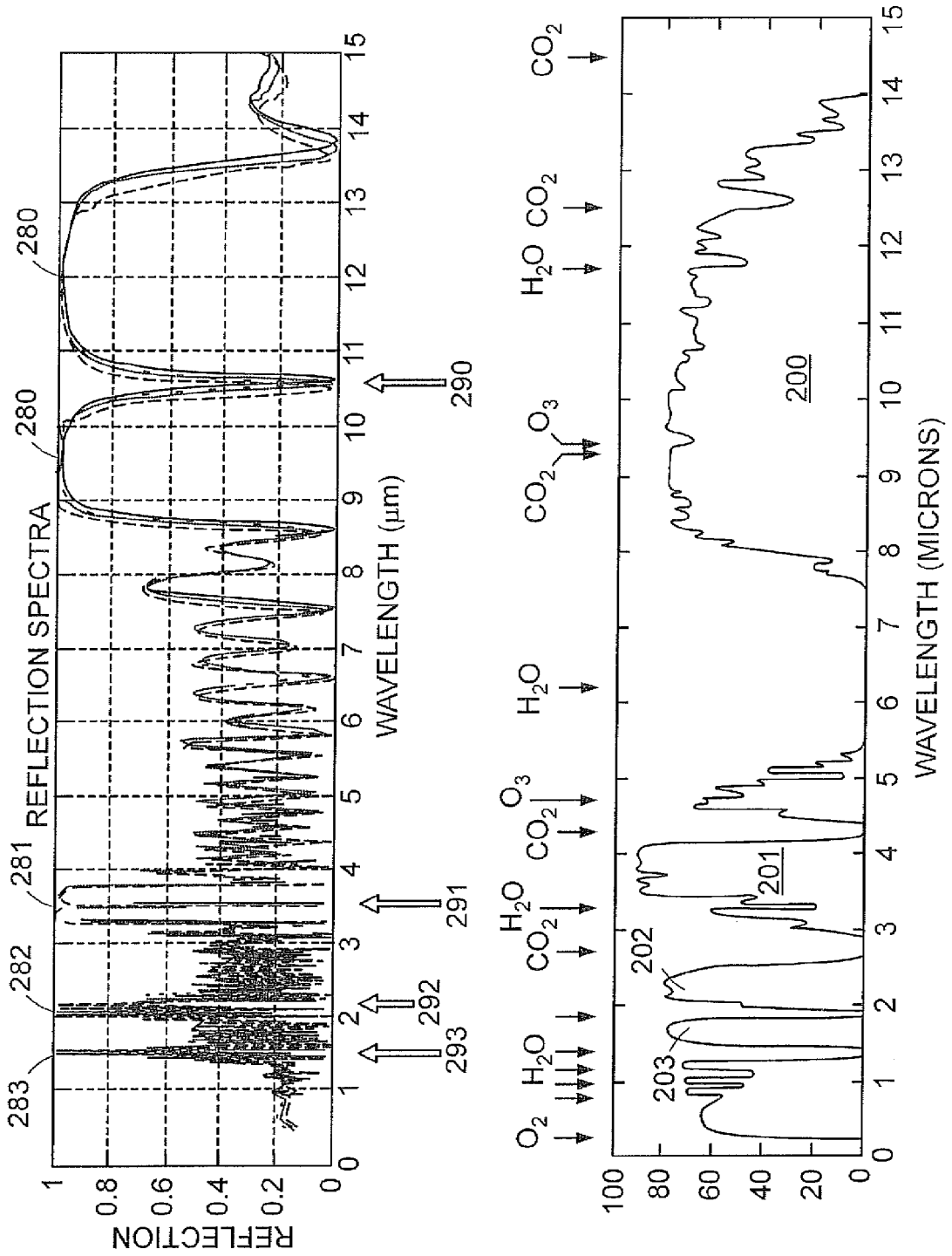
FIG. 20 are graphs showing the calculated spectral response of a multi-spectral detection pixel combining long-infrared, mid-infrared and near-infrared optical detection; and the spectral response of the pixel, and the optical frequencies of the localized resonant modes, that can be designed to overlap the transmission windows of the atmosphere.

Another embodiment of a multi-spectral detection pixel in accordance with the invention is illustrated in FIG. 20. In this embodiment the periodic latticed dielectric reflector structure [2] is composed of an alternating layering of As—S and As—Se—Te chalcogenide glasses, with refractive indices of n=2.3 and n=3.2 respectively. The thickness of the alternating layers is adjusted such that the fundamental photonic bandgap [280] covers the wavelength range 8500 nm to 13500 nm, overlapping the long-infrared atmospheric transparency window [200] shown in the graph below; while the third-order photonic bandgap [281] covers the wavelength range 3000 nm to 4000 nm, overlapping the mid-infrared atmospheric transparency window [201]; while the fifth-order photonic bandgap [282] covers the wavelength range 2000 nm to 2500 nm, overlapping the near/mid-infrared atmospheric transparency window [202]; while the seventh-order photonic bandgap [283] covers the wavelength range 1300 nm to 1600 nm, overlapping the near-infrared atmospheric transparency window [203].

The photonic bandgaps have odd order numbering because they correspond to a k-vector of k=π/a, whereas photonic bandgaps of even order numbering relates to a k-vector of k=0, which do not manifest themselves as reflection in the pixel's spectral response. The optical cavity [3] of this embodiment is designed such that there is only one localized state within each photonic bandgaps: a long-infrared localized resonant mode [290] within the fundamental photonic bandgap [280], a mid-infrared localized resonant mode [291] within the third-order photonic bandgap [281], a near/mid-infrared localized resonant mode [292] within the fifth-order photonic bandgap [282] and a near-infrared localized resonant mode [293] within the seventh-order photonic bandgap [283]. As explained previously, it can be shown that, by a judicious design of each respective layers of the pixel, the four metal-semiconductor-insulator inclusions of this embodiment can be positioned such that they overlaps maximally with the electromagnetic field of their respective localized resonant modes and minimally with the electromagnetic field of the other localized resonant modes, thus providing detection based on modal discrimination of localized eigenstates.

Figure 21:
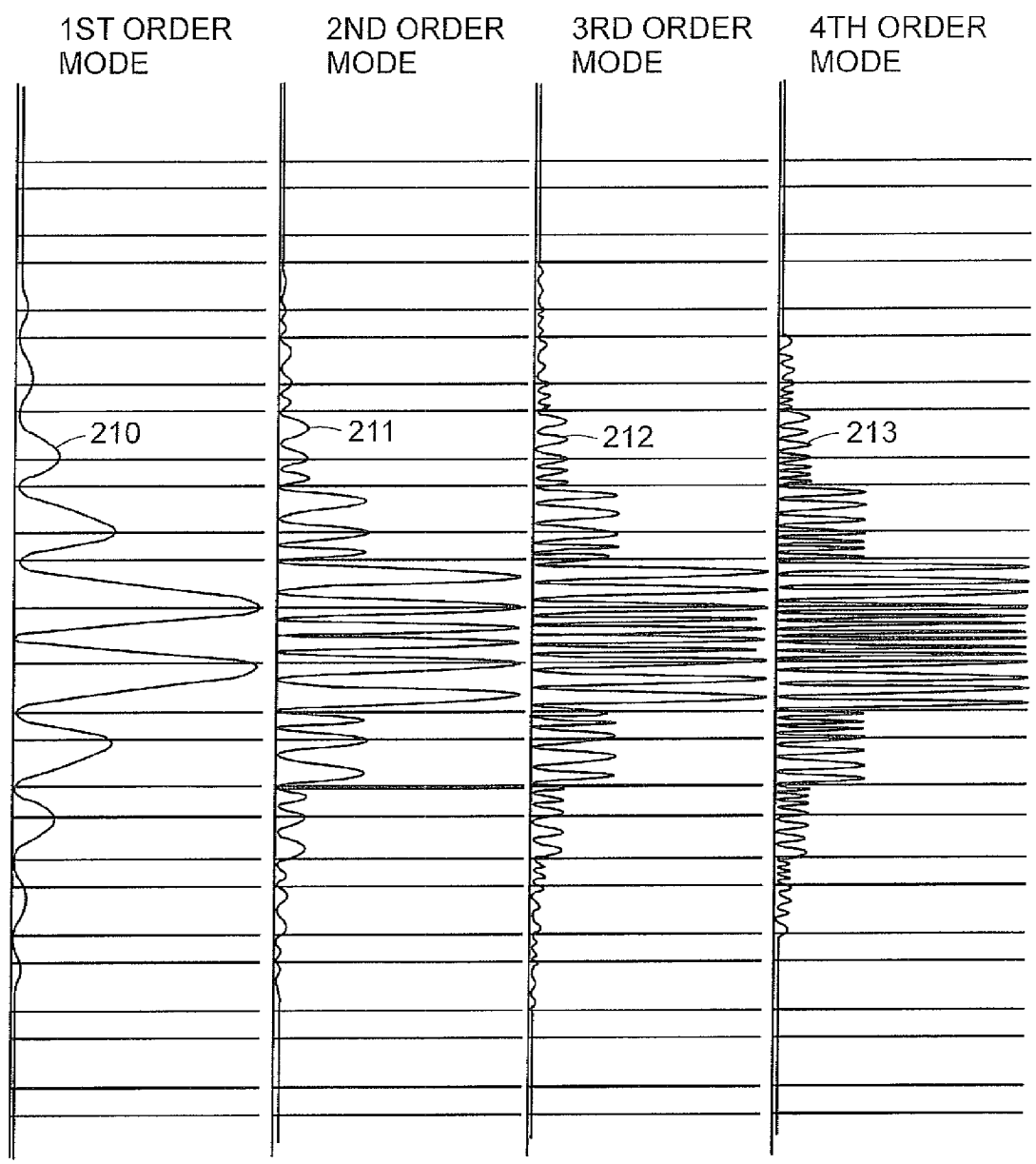
FIG. 21 shows the computed electromagnetic field profiles (eigenstates) of the optical resonant modes of the embodiment of FIG. 20.

However, as shown in FIG. 21, such a spectral detection based on modal discrimination can be rendered difficult in view of the highly crowded electromagnetic field distributions of the localized resonant modes inside the optical cavity of the pixel [210] [211] [212] [213]. An inclusion placed optimally on the field maxima of one of the localized resonant modes may interact with the other localized resonant modes as well, thus generating an unacceptable level of electrical crosstalk. However, the wide wavelength difference between the resonant localized modes provides the benefit that the respective inclusions may not show any photoconductive or photovoltaic effect at any modes other than the one the material composition of the inclusion is designed for, thus lowering electrical detection crosstalk between the modes. Modal discrimination of localized eigenstates can be improved not only by an optimal placement of the metal-semiconductor-insulator inclusion with respect to the eigenstates, but also by a judicious materials composition adjustment of the spectral absorption selectivity of each inclusions. The material composition of the inclusion can be adjusted such that the photoconductive or photovoltaic effect is optimal only at the frequency of one localized resonant mode. It is known, for instance, that the photoconductive As—Se—Te—Cu semiconductor alloy has a photoconductive spectral response dependent on the Te and Cu molar concentrations, such that for example high Te and Cu molar concentrations work best only for long-infrared wavelengths, and the low Te and Cu molar concentrations work best only for near-infrared wavelengths.

It can be seen that, for the embodiment shown in FIG. 20, the spectral response of the pixel conforms quite well to the spectral transparency of Earth's atmosphere, such that the pixel remains blind to all optical frequencies other than the resonant ones. This pixel embodiment can be used for the focal plane array of an infrared camera for outside surveillance, with a multi-spectral capability combining long-infrared, mid-infrared and near-infrared imaging.

It is recognized that those skilled in the art may make various modifications and additions to the embodiments described above without departing from the spirit and scope of the invention. The exemplary abovementioned embodiments are not limited to the said particular optical wavelengths, or the said particular materials, or the said particular structures, or the said particular densities of states. The exemplary embodiments described above are provided by way of illustration in order to help the understanding of the multi-spectral detection scheme, and are not representative of any specific limitations. Various modifications can be made to the said pixel embodiments such as to achieve multi-spectral detection of light combining visible and infrared optical regimes, or multi-spectral detection of light in the infrared regime only.

The multi-spectral detection pixel in accordance with the present invention is monolithic, in the sense that all the layers are deposited on a substrate, there are no movable parts in the layers, and the fabrication process uses standard deposition techniques (physical vapor deposition, chemical vapor deposition, epitaxial crystal growth, etc.) and standard lithographic techniques (contact lithography, wet etching, dry etching, etc.) commonly known in VLSI technology. For example, in the embodiment depicted in FIG. 4, the chalcogenide thin films are deposited on a silicon substrate and can be wet etched with common hydroxide solutions or dry etched with fluorine gases, and the pixels and electrodes can be patterned using standard 0.5 μm resist contact lithography. Because the multi-spectral detection pixel in accordance with the present invention is monolithic, and the connecting platform can be a silicon integrated circuit, the fabrication process can be made compatible with standard very large scale integration (VLSI) fabrication tools widely available in the semiconductor industry. The multi-spectral detection pixel in accordance with the invention is preferably made of materials encompassing the CMOS materials range, but is not restricted to the CMOS materials range or to specific chemical compositions of material.

It is assumed that the pixel in accordance with the invention is made of materials having negligible non-linear effects with respect to the intensity of incident light. Optical non-linearity of the pixel materials would perturb the electromagnetic field profile of the localized resonant modes depending on the incident optical intensity, and therefore degrade the overlapping of the modes with the respective inclusions. Also, the assumption of negligible optical non-linearity in the pixel leads to the assumption that the resonant modes do not optically interact with any other resonant modes within the same pixel, or with any other resonant modes within different pixels.

Figure 22:
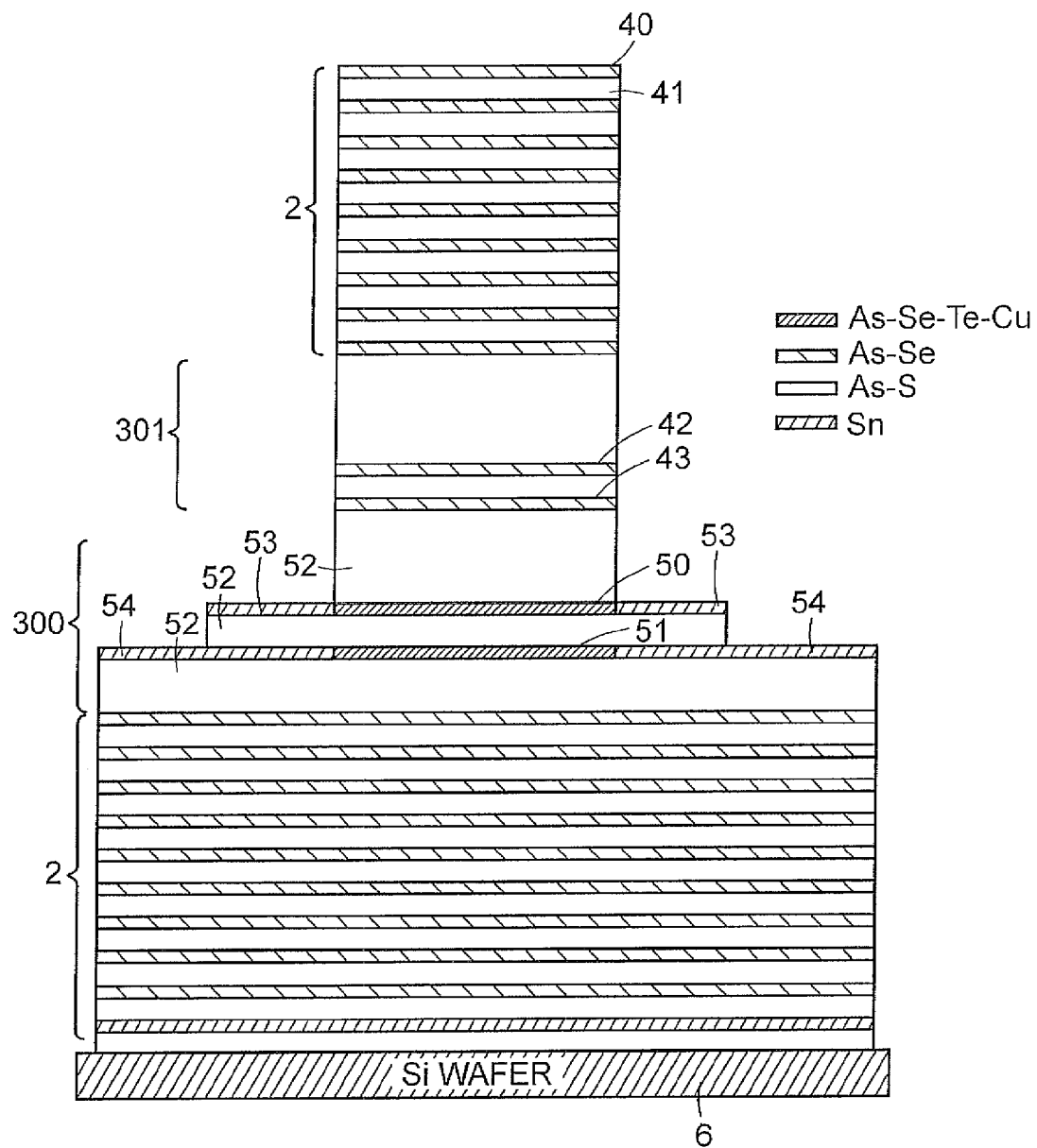
FIG. 22 is a schematic cross-section of a multi-spectral detection pixel with two detected optical frequencies and two optical cavities.

The inventive pixel is not limited to only one optical cavity such as shown in [3] of FIG. 4. Several optical cavities can be included within the pixel and coupled to each other such that the localized resonant modes can have their electromagnetic fields distributed over several optical cavities. A two-cavity embodiment is illustrated in FIG. 22. This embodiment has two coupled optical cavities [300] and [301], separated by a few layers of alternating dielectric reflectors [42] [43]. Other embodiments can comprise two or more coupled cavities in order to form a multi-cavity pixel. Such cavity coupling usually splits every localized resonant modes into even and odd electromagnetic field symmetries, with narrow frequency separations. Coupling several optical cavities allows the tailoring of the pixel spectral response such as finer imaging spectral resolutions. An exemplary embodiment of a multi-cavity pixel is a pixel comprising two or more cavities of different lengths, and/or of different refractive indexes, wherein phase-matching between the different cavities occurs only at different longitudinal modes for each cavity, at a specific wavelength. Another set of different longitudinal modes for each cavity can be excited by changing the incidence angle as illustrated in FIGS. 7 and 8, and whenever phase-matching occurs between the different cavities a new resonant wavelength will be selected, thus performing a Vernier-type optical frequency tuning as function of incidence angle.

Figure 23:
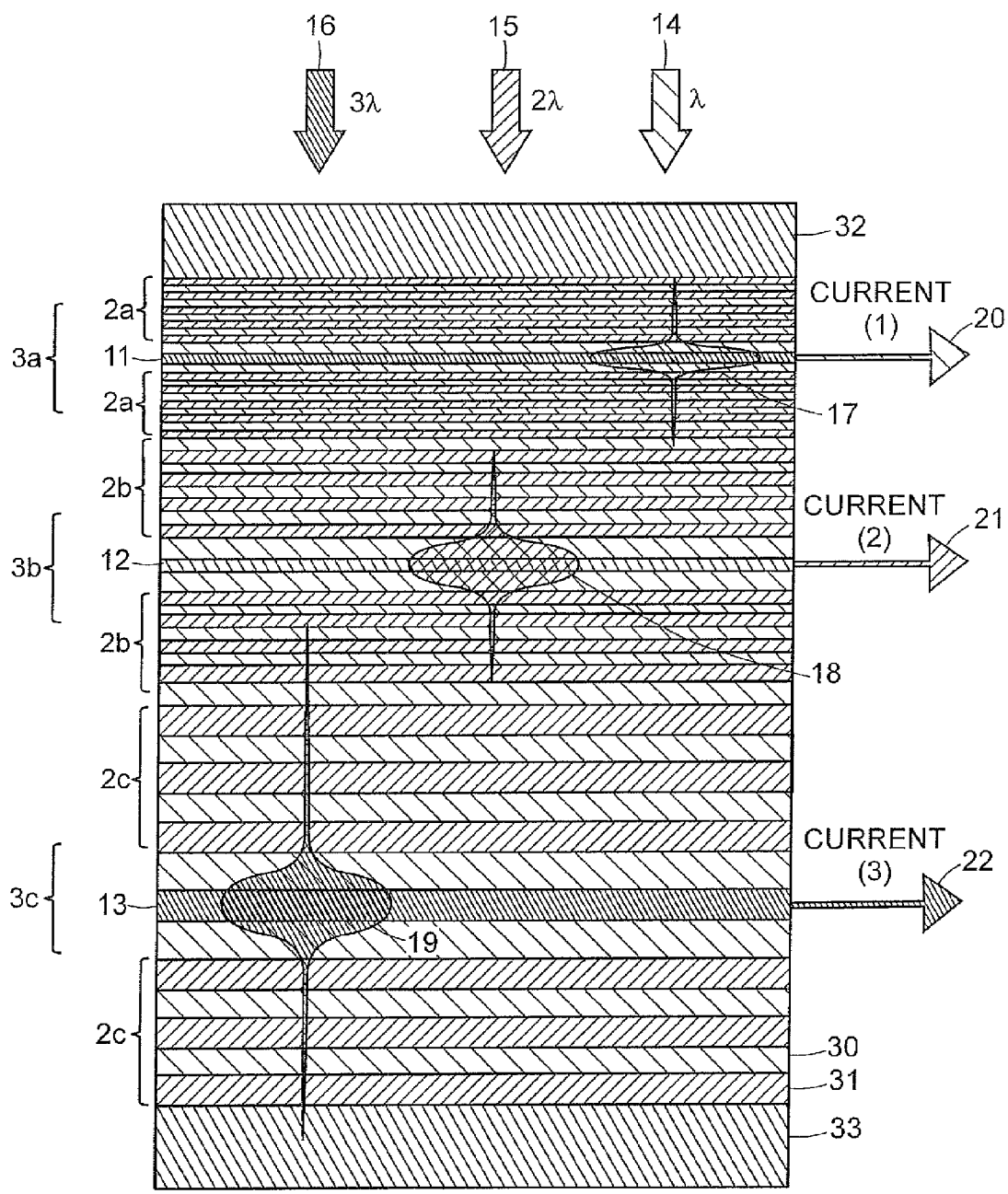
FIG. 23 is a schematic cross-section of a multi-spectral detection pixel illustrated in FIG. 1, with three detected optical frequencies, wherein the resonant modes are distributed over several optical cavities.

The inventive pixel is not limited to only one optical cavity such as shown in [3] of FIG. 4. Several optical cavities can be included within the pixel such that the localized resonant modes have their electromagnetic fields distributed over several coupled optical cavities. A three-cavity embodiment is illustrated in FIG. 23. This multi-spectral detection pixel embodiment includes three coupled resonant optical cavities [3a] [3b] and [3c], each one of them surrounded by two periodic latticed dielectric reflector structures [2a] [2b] and [2c] respectively. Coupling between the different cavities is necessary in order to ensure that external illumination has a pathway through the pixel to excite the different resonant modes. Optically active metal-semiconductor-insulator inclusions [11], [12] and [13] are located inside the optical cavities [3a] [3b] and [3c] respectively. The purpose of these inclusions is to convert the incident optical signals [14], [15], [16], of wavelengths λ, 2λ and 3λ, respectively, into electrical signals [20], [21], [22], respectively, by virtue of an optimal overlap between the inclusions [11], [12], [13] and one of the electromagnetic field profile maxima of the respective localized resonant modes [17], [18], [19] inside the optical cavities. The periodic latticed dielectric reflector structures [2a] [2b] and [2c] can have different thicknesses according to the desired Q-factor of the optical cavities, and the resonant optical cavities [3a] [3b] and [3c] can have different thicknesses according to the desired density of resonant states within the respective photonic bandgaps. The localized resonant modes [17], [18] and [19] are distributed over all the optical cavities of the pixel, but by judicious design of the pixel microstructure the eigenstates can be localized maximally at a specific optical cavity as illustrated in FIG. 23.

Figure 24:
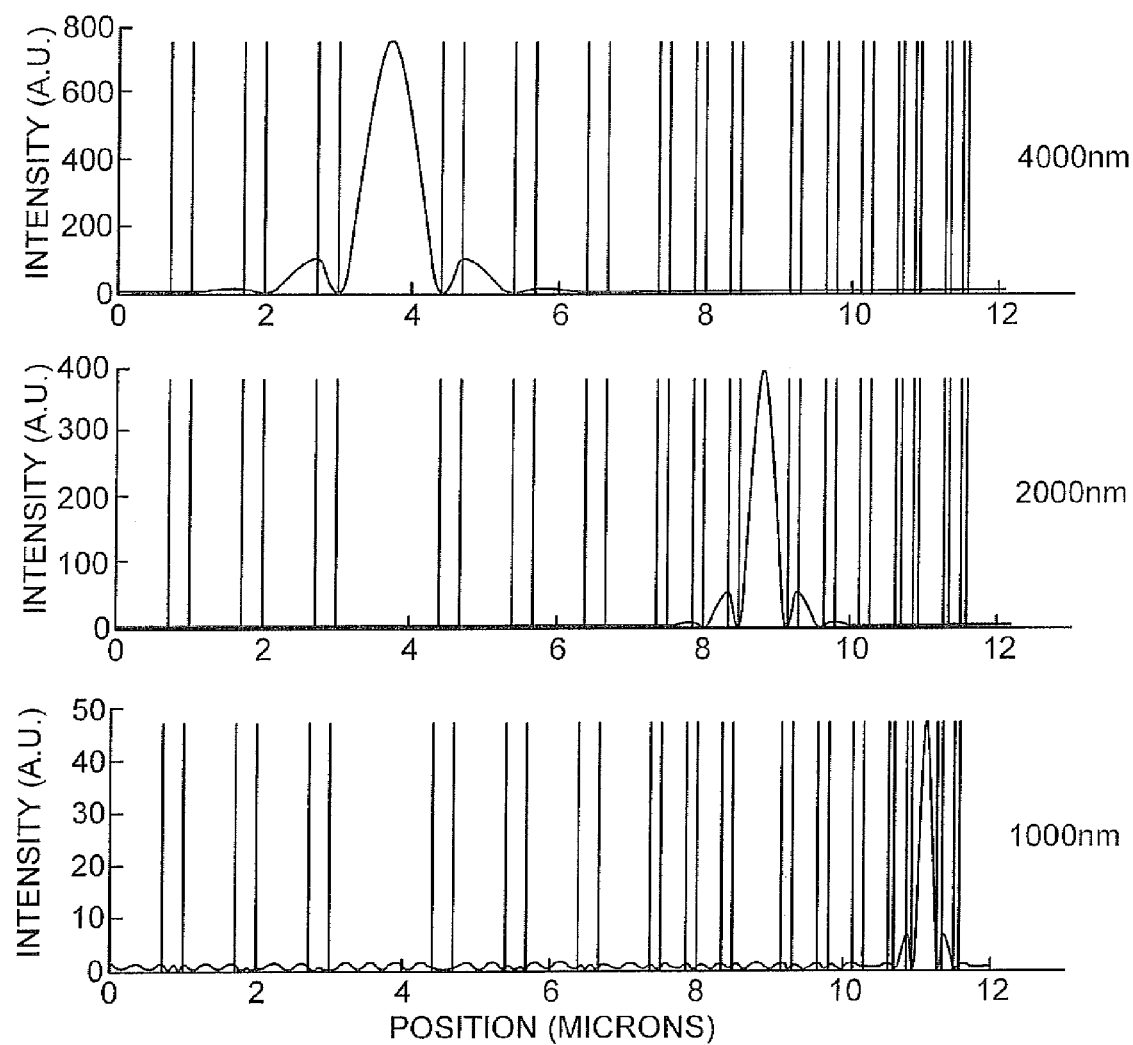
FIG. 24 shows the computed electromagnetic field profiles (eigenstates) of the optical resonant modes of the three-wavelength embodiment of FIG. 23.

FIG. 24 shows the calculated eigenstates of the exemplary three-wavelength embodiment shown in FIG. 23, made of silica and silicon layer materials. The three different localized resonant modes have their electromagnetic fields distributed over three different coupled optical cavities, with eigenstates localized maximally in different optical cavities. In this embodiment, the long-wavelength eigenstate is localized maximally in the first optical cavity, while the medium-wavelength eigenstate is localized maximally in the second optical cavity, while the short-wavelength eigenstate is localized maximally in the third optical cavity. Such eigenstate distribution over several optical cavities provides enhanced modal discrimination and reduced electrical crosstalk.

Figure 25:
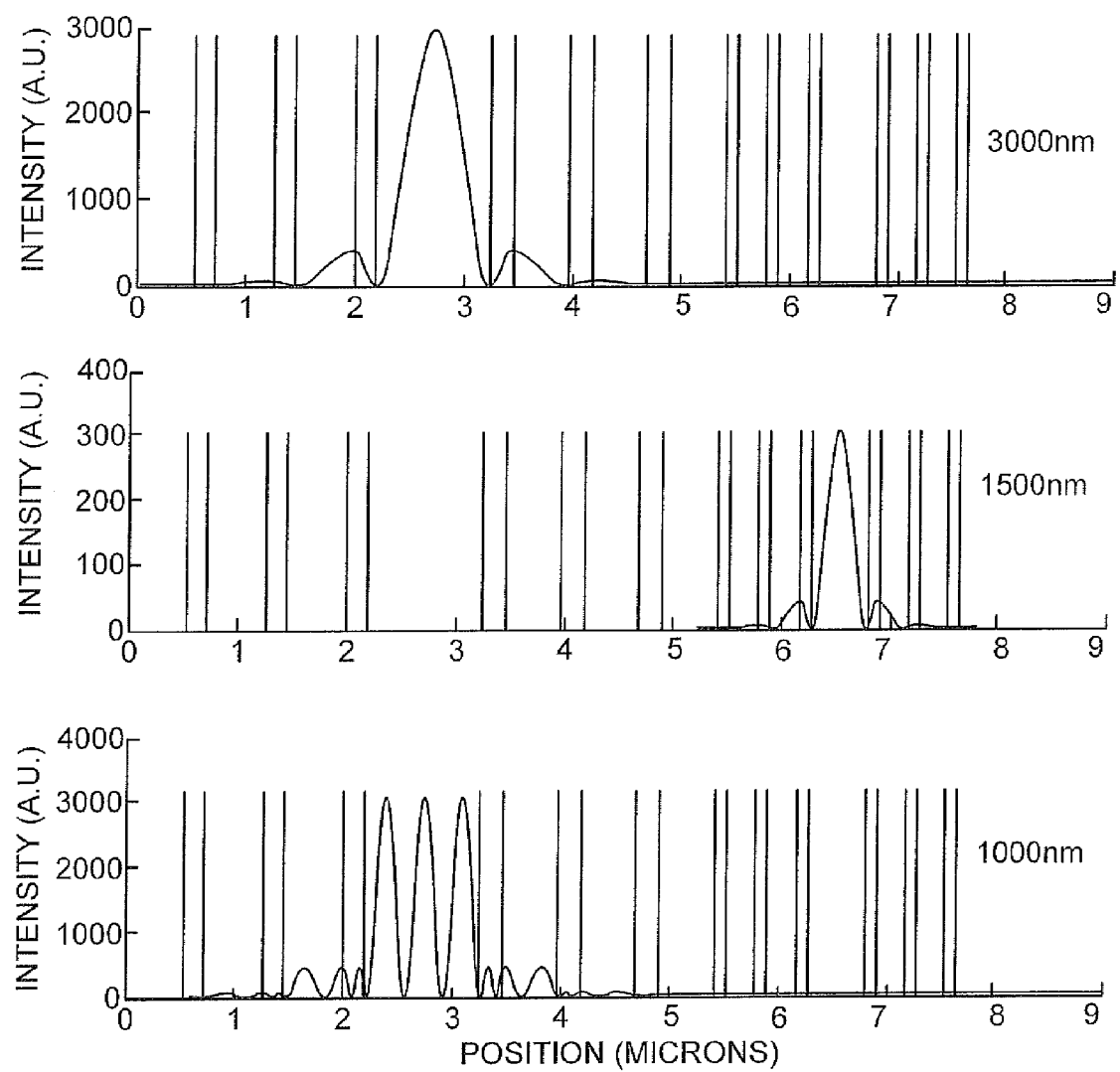
FIG. 25 shows the computed electromagnetic field profiles (eigenstates) of the optical resonant modes of a modified three-wavelength embodiment of FIG. 23

FIG. 25 shows the calculated eigenstates of a modified three-wavelength embodiment shown in FIG. 23, made of silica and silicon layer materials. The three different localized resonant modes have their electromagnetic fields distributed over two different coupled optical cavities, with eigenstate maxima localized differently. In this embodiment, the long-wavelength eigenstate is localized maximally in the first optical cavity, while the medium-wavelength eigenstate is localized maximally in the second optical cavity, while the short-wavelength eigenstate is localized maximally in the first optical cavity. In accordance with the invention, various other embodiments can be designed based on the scheme of several localized eigenstates being distributed over different optical cavities.

The pixel in accordance with the invention is not limited to visible or infrared wavelengths. According to the wavelength scaling of Bloch's theorem, the pixel micro-structure can be designed, and the dielectric materials chosen, to support localized resonant modes in the ultraviolet optical regime (i.e., wavelength range between 50 nm and 360 nm), or in the visible optical regime (i.e., wavelength range between 360 nm and 700 nm), or in the near-infrared regime (i.e., wavelength range between 700 nm and 2000 nm), or in the mid-infrared regime (i.e., wavelength range between 2000 nm and 5000 nm), or in the long-infrared regime (i.e., wavelength range between 5000 nm and 100 000 nm), or a combination of two or more such optical regimes. Exemplary photosensitive material composition of the semiconductor part of the metal-semiconductor-insulator inclusions are Cadmium-Sulfide (CdS) or Silicon (Si) for the visible optical regime, Germanium (Ge) or Indium-Gallium-Arsenide (InGaAs) for the near-infrared optical regime, Lead-Telluride (PbTe), Lead-Sulfide (PbS) or Germanium-Tin (GeSn) for the mid-infrared optical regime, and Mercury-Cadmium-Telluride (HgCdTe) for the long-infrared optical regime. Other material compositions are possible, such as As—Se—Te—Cu metal chalcogen semiconductor compounds.

An exemplary embodiment of the invention is a pixel where the fundamental photonic bandgap is designed to provide a bandwidth $\Delta v$ of at least $\Delta v/v=0.1$, where $\Delta v$ is the frequency range covered by the fundamental photonic bandgap and $v$ is the central optical frequency of the fundamental photonic bandgap. If the bandwidth is smaller than $\Delta v/v=0.1$, then a large residual bandwidth of non-resonant modes is allowed to penetrate the pixel structure down to the optical cavity, such that the metal-semiconductor-insulator inclusions may be excited by these non-resonant modes, thus degrading electrical crosstalk and the frequency-specific detection of the device.

It is recognized that those skilled in the art may make various modifications and additions to the embodiments described above without departing from the spirit and scope or the present contribution to the art, namely the detection scheme for a multi-spectral photonic pixel herein based on modal discrimination of localized eigenstates. Accordingly, it is to be understood that the protection sought to be afforded hereby should be deemed to extend to the subject matter claims and all equivalents thereof fairly within the scope of the invention.

What is claimed is:

1. A multi-spectral focal plane array comprising:
    a plurality of multi-spectral detection pixels, and;
    a connecting platform to electrically connect the said pixels, wherein each said multi-spectral detection pixel comprises:
        at least two periodic latticed dielectric reflector structures having alternating layers of high-index dielectric material comprising $As_2Se_3$ and low-index material comprising $As_2S_3$, and;
        at least one optical cavity between said latticed dielectric reflector structures, and;
        a plurality of photonic bandgaps in the spectral response of said pixel, wherein each said optical cavity comprises:
            at least two optical resonant modes per said optical cavity, each optical resonant mode being a quantized and localized electromagnetic Bloch mode, and;
            at least two metal-semiconductor-insulator inclusions inside said optical cavity; said at least two metal-semiconductor-insulator inclusions comprising a photoconductive As—Se—Te—Cu layer wherein each said inclusion is located at one of the electromagnetic field amplitude maxima of one of the said optical resonant mode, and wherein each said inclusion performs optical-to-electrical signal conversion, wherein each said inclusion has a frequency-specific photodetection based on modal discrimination of localized eigenstates by mapping the magnitude distribution of a first eigenstate as a function of position inside the optical cavity to produce a first map, and comparing the first map with a second map showing the combined magnitudes of all other eigenstates in determining the optimal position of one of at least two metal-semiconductor-insulator inclusions inside the cavity, and wherein the electrical signal carried by said inclusion is brought to said connecting platform.

2. The multi-spectral focal plane array of claim 1, wherein said multi-spectral detection pixel detects between two to more than five different optical frequencies.

3. The multi-spectral focal plane array of claim 1 further comprising an array of N-by-M multi-spectral detection pixels, where N and M are integer numbers equal to 1 or larger.

4. The multi-spectral focal plane array of claim 1, wherein said connecting platform comprises a silicon integrated circuit chip.

5. The multi-spectral focal plane array of claim 1, wherein said detection pixels are deposited on said connecting platform.

6. The multi-spectral focal plane array of claim 1, wherein said periodic latticed dielectric reflector structures are made of amorphous, glassy, polycrystalline or crystalline dielectric materials.

7. The multi-spectral focal plane array of claim 1, wherein said periodic latticed dielectric reflector structures can have different thicknesses.

8. The multi-spectral focal plane array of claim 1, wherein said plurality of photonic bandgaps comprises a fundamental photonic bandgap and higher order photonic bandgaps.

9. The multi-spectral focal plane array of claim 1, wherein the length of said optical cavity is designed to support a specific density of states within the said plurality of photonic bandgaps.

10. The multi-spectral focal plane array of claim 1, wherein said optical resonant mode corresponds to ultraviolet light of optical wavelength lower than 360 nm.

11. The multi-spectral focal plane array of claim 1, wherein said optical resonant mode corresponds to visible light of optical wavelength in the range between 360 nm and 700 nm.

12. The multi-spectral focal plane array of claim 1, wherein said optical resonant mode corresponds to near-infrared light of optical wavelength in the range between 700 nm and 2000 nm.

13. The multi-spectral focal plane array of claim 1, wherein said optical resonant mode corresponds to mid-infrared light of optical wavelength in the range between 2000 nm and 5000 nm.

14. The multi-spectral focal plane array of claim 1, wherein said optical resonant mode corresponds to long-infrared light of optical wavelength larger than 5000 nm.

15. The multi-spectral focal plane array of claim 1, wherein said optical resonant modes have tunable optical frequencies.

16. The multi-spectral focal plane array of claim 1, wherein said optical resonant modes are distributed over more than one optical cavity in the same said pixel.

17. The multi-spectral focal plane array of claim 1, wherein said optical resonant mode has an electromagnetic field profile different from other optical resonant modes supported by the same said pixel.

18. The multi-spectral focal plane array of claim 1, wherein the uniqueness of said electromagnetic field amplitude of said optical resonant mode provides a basis for modal discrimination of the plurality of optical resonant modes within the same said pixel, which provides a basis for frequency-selective optical detection.

19. The multi-spectral focal plane array of claim 1, wherein said metal-semiconductor-insulator inclusion has an absorption spectrum covering the optical frequency of a specific optical resonant mode of said pixel, and generates an electrical signal when light is absorbed from that specific optical resonant mode of said pixel.

20. The multi-spectral focal plane array of claim 1 wherein said metal-semiconductor-insulator inclusion preferentially detects light of a specific optical resonant mode of said pixel.

21. The multi-spectral focal plane array of claim 1 wherein said metal-semiconductor-insulator inclusion is made of a composite of high electrical conductivity, medium electrical conductivity and low electrical conductivity materials.

22. The multi-spectral focal plane array of claim 1, wherein said metal-semiconductor-insulator inclusion forms a photoconductive optical detector.

23. The multi-spectral focal plane array of claim 1, wherein said metal-semiconductor-insulator inclusion forms a p-n, or a p-i-n, junction photovoltaic optical detector.

24. The multi-spectral focal plane array of claim 1, wherein said metal-semiconductor-insulator inclusion has its semiconductor and insulator parts made of amorphous, polycrystalline or crystalline materials.

25. The multi-spectral focal plane array of claim 1, wherein the metal part of said metal-semiconductor-insulator inclusion brings the generated electrical signal to said connecting platform.

26. A method of producing multi-spectral detection pixels based on modal discrimination of localized eigenstates, comprising:

positioning at least two metal-semiconductor-insulator inclusions for maximal field overlap with respect to a single localized Bloch mode inside a pixel, said at least two metal-semiconductor-insulator inclusions comprising a photoconductive As—Se—Te—Cu layer;

positioning the same at least two metal-semiconductor-insulator inclusions for minimal field overlap with respect to a plurality of different localized Bloch modes inside said pixel by mapping the magnitude distribution of a first eigenstate as a function of position inside the optical cavity to produce a first map, and comparing the first map with a second map showing the combined magnitudes of all other eigenstates in determining the optimal position of said at least two metal-semiconductor-insulator inclusions inside the cavity;

adjusting the material composition of the same at least two metal-semiconductor-insulator inclusions for maximal optical absorption of the same single localized Bloch mode inside said pixel; and adjusting the material composition of the same at least two metal-semiconductor-insulator inclusions for minimal optical absorption of the same plurality of different localized Bloch modes inside said pixel.

27. The method of claim 26, wherein the method steps are repeated iteratively for all metal-semiconductor-insulator inclusions inside said pixel.

* * * * *